United States Patent
Scott

(10) Patent No.: US 9,804,273 B2
(45) Date of Patent: Oct. 31, 2017

(54) COMBINED N-TYPE AND P-TYPE MOS-BASED RADIATION SENSORS FOR ENVIRONMENTAL COMPENSATIONS

(71) Applicants: LANDAUER, INC., Glenwood, IL (US); PURDUE RESEARCH FOUNDATION, West Lafayette, IN (US)

(72) Inventor: Sean M. Scott, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 14/870,629

(22) Filed: Sep. 30, 2015

(65) Prior Publication Data

US 2016/0187495 A1    Jun. 30, 2016

Related U.S. Application Data

(60) Provisional application No. 62/065,087, filed on Oct. 17, 2014.

(51) Int. Cl.
*G01T 1/02* (2006.01)
*H01L 31/119* (2006.01)
(Continued)

(52) U.S. Cl.
CPC ............... *G01T 1/026* (2013.01); *G01T 7/00* (2013.01); *G01T 7/005* (2013.01);
(Continued)

(58) Field of Classification Search
CPC ....................................................... G01T 1/026
See application file for complete search history.

(56) References Cited

U.S. PATENT DOCUMENTS 4,484,076 A    11/1984  Thomson
4,658,281 A *  4/1987   Sevenhans et al. .......... 257/230
(Continued)

FOREIGN PATENT DOCUMENTS

EP    2381273 A2    10/2011

OTHER PUBLICATIONS

International Search Report and Written Opinion dated Jan. 27, 2016 in corresponding International Application No. PCT/IB2015/057533.
(Continued)

*Primary Examiner* — David Porta
*Assistant Examiner* — Hugh H Maupin
(74) *Attorney, Agent, or Firm* — Harness, Dickey & Pierce, P.L.C.

(57) ABSTRACT

An apparatus is disclosed comprising a metal oxide semiconductor capacitor (MOSCAP) comprising one or more gate layers disposed over a contiguous radiation-sensitive insulating layer, wherein the contiguous radiation-sensitive insulating layer comprises one or more contacting dielectric layers. A method may be employed to measure a value of a radiation-induced capacitance response of a metal oxide semiconductor capacitor (MOSCAP) from multiple non-contacting gate layers disposed over a radiation-sensitive layer comprising of one or more contacting dielectric layers to thereby enhance a sensitivity and a resolution of a radiation response of the MOSCAP.

7 Claims, 30 Drawing Sheets

(51) Int. Cl.
*H01L 31/18* (2006.01)
*G01T 7/00* (2006.01)
*H01L 27/144* (2006.01)

(52) U.S. Cl.
CPC ........ *H01L 27/1443* (2013.01); *H01L 31/119* (2013.01); *H01L 31/1804* (2013.01)

(56) References Cited

U.S. PATENT DOCUMENTS

| | | |
|---|---|---|
| 2005/0099188 A1 | 5/2005 | Baxter |
| 2010/0164534 A1 | 7/2010 | Rozenfeld |
| 2010/0219494 A1 | 9/2010 | Barnaby |
| 2011/0121980 A1 | 5/2011 | Doughty et al. |
| 2013/0048869 A1 | 2/2013 | Kominami et al. |
| 2014/0299783 A1 | 10/2014 | Valentino et al. |

OTHER PUBLICATIONS

International Search Report and Written Opinion dated Jan. 27, 2016 in corresponding International Application No. PCT/IB2015/057534.

* cited by examiner

COMBINED N-TYPE AND P-TYPE MOS-BASED RADIATION SENSORS FOR ENVIRONMENTAL COMPENSATIONS

CROSS-REFERENCE TO RELATED APPLICATIONS

This application claims benefit of priority to U.S. Provisional Patent Application No. 62/065,087 to Valentino, et al., entitled, "MOS CAPACITOR-BASED, ACCUMULATING, RADIATION-SENSITIVE DETECTOR FOR OCCUPATIONAL, ENVIRONMENTAL AND MEDICAL DOSIMETRY," filed Oct. 17, 2014 which is incorporated herein by reference in its entirety.

BACKGROUND

Field of the Invention

The present invention relates to radiation dosimetry and more specifically to high sensitivity radiation dose semiconductor sensors for occupational dosimetry.

SUMMARY

The foregoing needs are met, to a great extent, by the present invention wherein, according to a first broad aspect, the present invention provides a method comprising measuring a first value of a response parameter of a first sensor, and measuring a second value of the response parameter of a second sensor, wherein the first sensor and the second sensor have a same response to a first stimuli and an opposite response to a second stimuli thereby isolating an effect of the first stimuli and the second stimuli on the response parameter when both the first stimuli and the second stimuli are present.

According to a second broad aspect, the present invention provides an apparatus comprising a substrate having an n-type surface portion, and a p-type surface portion. The apparatus may also comprise an insulating region comprising of one or more dielectric layers disposed over the substrate. First and a second adjacently disposed non-contacting conductive gate layers may be disposed over the n-type surface portion of the substrate and the p-type surface portion of the substrate, respectively, and isolated therefrom by the insulating region to thereby form a combined n and p-type metal oxide semiconductor capacitor (MOSCAP) structure with environmental noise immunity and improved radiation sensitivity and resolution.

According to a third broad aspect, the present invention provides an apparatus comprising a metal oxide semiconductor capacitor (MOSCAP) comprising one or more gate layers disposed over a contiguous radiation-sensitive insulating layer, wherein the contiguous radiation-sensitive insulating layer comprises one or more contacting dielectric layers.

According to a fourth broad aspect, the present invention provides an apparatus comprising a metal oxide semiconductor capacitor (MOSCAP) comprising a plurality of non-contacting conductive gate layers disposed over a contiguous radiation-sensitive insulating layer, wherein the contiguous radiation-sensitive insulating layer comprises one or more contacting dielectric layers. The contiguous radiation-sensitive insulating layer may be disposed above a semiconductor substrate, having a first portion and a second portion, wherein the first portion and the second portion have an opposite polarity conductivity. At least one first conductive gate layer of the plurality of non-contacting conductive gate layers may be disposed over the first portion of the semiconductor substrate and at least one second conductive gate layer of the plurality of non-contacting gate layers is disposed over the second portion of the semiconductor substrate.

According to a fifth broad aspect, the present invention provides a method comprising measuring a value of a radiation-induced capacitance response of a metal oxide semiconductor capacitor (MOSCAP) from multiple non-contacting gate layers disposed over a radiation-sensitive layer comprising of one or more contacting dielectric layers to thereby enhance a sensitivity and a resolution of a radiation response of the MOSCAP.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE PREFERRED EMBODIMENTS

Description

While the present invention is disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof. It is understood that other embodiments may be utilized and structural changes may be made without departing from the scope of the invention.

A conventional solution to solid-state dosimetry includes the metal-oxide-semiconductor field-effect transistor (MOSFET) radiation dosimeter. When the MOSFET is exposed to ionizing radiation electron hole pairs are generated in the oxide insulation layer. The junction potential between the device layers, or an applied positive potential to the gate, causes the electrons (whose mobility in $SiO_2$ at room temperature is about four orders of magnitude greater than holes) to quickly move towards the positively biased contact while the holes migrate to the oxide-silicon interface where they are trapped. These trapped charges cause a shift in the threshold voltage, since a larger negative voltage must be applied to the gate to overcome the electric field of the trapped charges. The threshold voltage shift is proportional to the radiation dose deposited in the oxide layer and this relationship is the basis for using MOSFETs as dosimeters.

The formation of radiation-induced oxide fixed charges densities, as a result of ionizing radiation passing through the oxide layer of a MOSFET sensor, permanently shifts the device threshold voltage parameter. By detecting this change in threshold voltage with an electronic circuit, the dose received can be determined. Several of the shortcomings associated with MOSFET radiation sensors, as discussed above, is overcome by utilizing the capacitance change resulting from incident radiation instead of utilizing the threshold voltage shift (as in MOSFET radiation sensors) for representing the radiation response of a MOS $Si/SiO_2$ device. This is in part due to the high sensitivity and precision of capacitance measurement electronics that far exceeds that of voltage measurement circuitry. Disclosed embodiments utilize the capacitance measurement circuitry as among the most sensitive available and results in a lower minimum resolvable dose, thus making a metal oxide semiconductor (MOS) based capacitive radiation sensing system viable for occupational dosimetry applications, capable of precise real-time measurement and readout of sensor data hence, enabling continuous monitoring of absorbed radiation dose.

Figure 1:
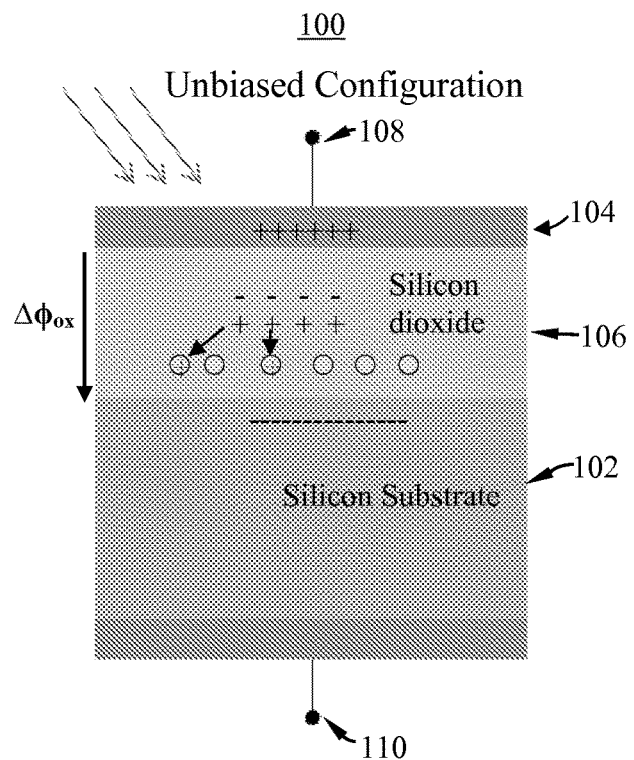
FIG. 1 illustrates a basic structure of a radiation-sensitive MOSCAP showing the electrostatic condition of the device in both an unbiased and externally biased state, according to one embodiment of the present invention.
Figure 1:
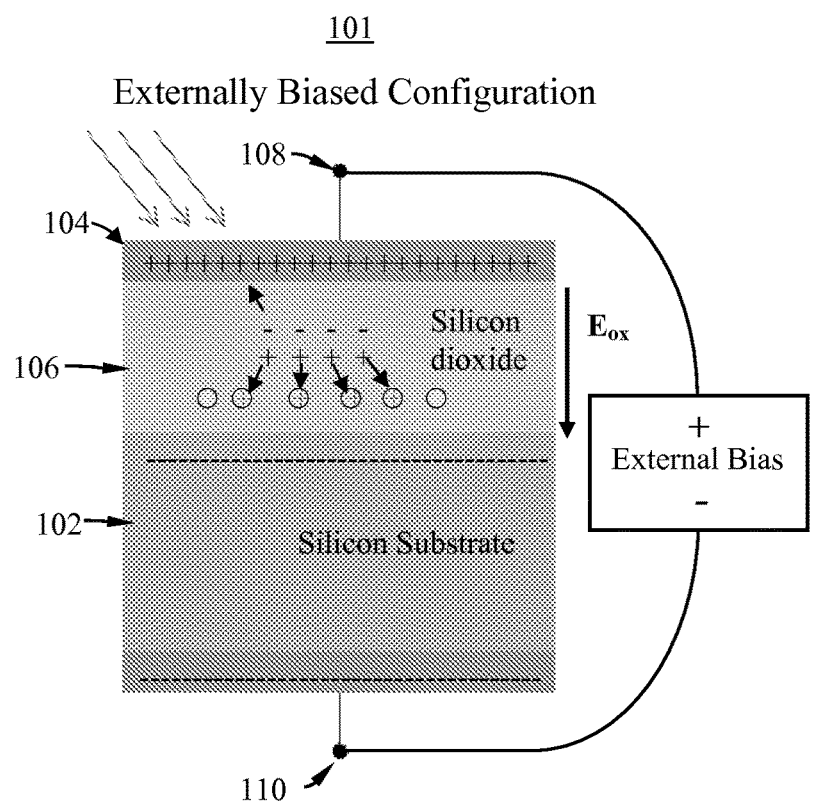

Additional limitations associated with the measurement and readout of a threshold voltage shift (in response to the radiation-induced build-up of an oxide trapped charge for estimating the absorbed dosage(s) of radiation(s)) includes the requirement of a wired readout circuit. Using the same principle of oxide-trapped charge build-up, but by monitoring the change in capacitance (instead of threshold voltage), a wireless dose sensor is disclosed in the present invention. The disclosed sensor element is a custom MOS capacitor (MOSCAP) which traps holes in proportion to the amount of ionizing radiation detected, thus permanently causing a lateral shift in the capacitance-voltage (C-V) response toward a more negative threshold voltage. A capacitive readout circuit, coupled to the output of one or more radiation-sensitive metal oxide semiconductor capacitors (MOSCAPs), measures the capacitance value of several redundant sensors at a given voltage in the depletion operation regime, records this value over time and occasionally transmits the stored values to a base station (i.e., any device or system with one or more serial interfaces capable, for example, of 2.4 Ghz communication, including peripheral devices such as workstations, laptops, tablet computers, desktop computers, etc.) via an on-board wireless transceiver IC. Constructing a radiation-sensitive MOSCAP sensor, according to disclosed embodiments, involves a structural alterations to the conventional MOSFET structure, namely removing the source and drain implants, making the gate electrode larger, and gate oxide thicker. The final structure is a MOS capacitor or MOSCAP. FIG. 1 illustrates a MOSCAP structure 100 in both unbiased configuration 101 and externally biased configuration 103. The MOSCAP structures 100 comprise a bottom conductive layer 102, a top conductive layer 104, and an insulating layer 106 sandwiched there in between. The bottom conductive layer 102 may comprise a silicon substrate and the top conductive layer 104 may comprise a polysilicon or metal layer. The insulting layer 106 may comprise a radiation-sensitive oxide layer. In one embodiment of the present invention the bottom conductive layer 102 may be produced from a p-type doped silicon substrate. In select embodiments of the present invention the radiation-sensitive oxide layer 106 may comprise silicon dioxide layer ($SiO_2$). Since the top conductive layer 104 also acts as the gate of a MOS transistor, the top conductive layer 104 is also referred to as the gate electrode. Conducting contact 108 are made to the top conductive layer 104 and conducting contact 110 are made to the bottom conducting layer 102, in order to electrically connect the apparatus to other electronic devices. In one embodiment of the present invention the conducting contact may comprise a titanium/gold compound that may be bonded to pins of a gold-plated TO header package for external connectivity.

A key feature of the MOSCAP is its voltage dependent capacitance, which is a manifestation of the same material properties behind the switching behavior of MOSFETs. Therefore, it is possible to perform C-V characterization on the MOSCAP device in order to assess voltage-dependent capacitance response and voltage values delineating its discrete regions of operation in accordance to the response trace illustrated in FIG. 2. The physical picture of the MOSCAP is that, depending on the gate voltage, majority or minority charge carriers can fill silicon energy sub-bands at the substrate-Oxide ($Si/SiO_2$) interface due to band bending of the silicon conduction and valence bands; also, the bulk of the semiconductor can become depleted of the majority charge carriers. The depletion or accumulation of charges at the semiconductor interface is controlled by the gate voltage.

Figure 2:
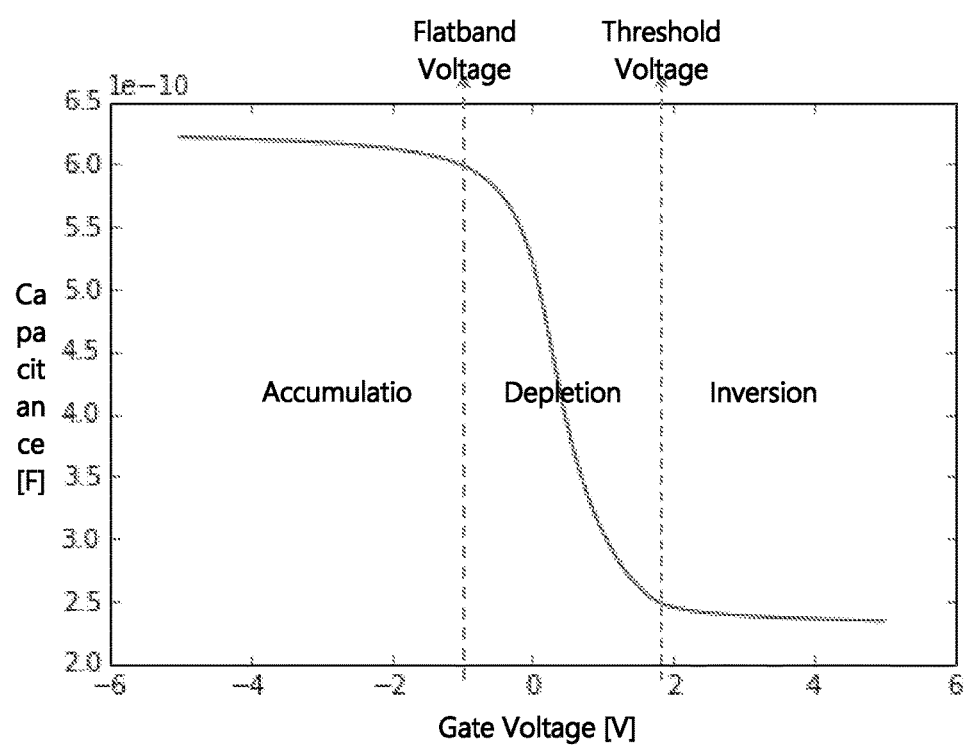
FIG. 2 is an illustration of the C-V response of a radiation-sensitive MOSCAP as a function an external bias applied across the radiation-sensitive oxide layer, according to one embodiment of the present invention.

The maximum capacitance that the MOSCAP can attain is the oxide capacitance. The oxide capacitance is the capacitance that the device approaches for gate voltages less than the flatband voltage as illustrated in FIG. 2. The capacitance changes with voltage, because an insulating region, that is depleted of charge carriers, forms in the semiconductor as the gate voltage is increased past the flatband voltage. Under accumulation conditions, the device capacitance is the same as the oxide capacitance. Since carriers can easily be moved to and from the interface, the charges build up at both sides of the oxide as in a parallel plate capacitor. This changes as the applied bias voltage (henceforth, referenced interchangeably as Gate voltage) becomes positive, thereby, creating a depletion layer in the semiconductor. This depletion layer prevents carriers from moving towards the semiconductor-oxide interface. The variation of the charge, therefore, occurs at the edge of the depletion region so that the measured capacitance is the series connection of the oxide capacitance and the depletion layer capacitance. The depletion region, forming a series capacitance with the oxide capacitance, varies inversely with the depth of the depletion layer. Since depletion width is dependent on the gate voltage, the semiconductor capacitance becomes dependent on the gate voltage. As the depletion width approaches zero, the total capacitance approaches the oxide capacitance. From the gate voltage dependent capacitance response curve in FIG. 2, it can also be seen that the capacitance reaches its minimum (depletion region reaches its maximum width) for applied bias voltages greater than the threshold voltage. This is the inversion region of the MOSCAP operation, referenced accordingly in FIG. 2. In this region the depletion layer width, hence, the MOSCAP capacitance, is almost independent of the applied bias voltage yielding a constant (and minimum) capacitance. The total capacitance can be obtained from a series connection of the oxide capacitance and the minimum capacitance of the depletion layer.

Figure 3:
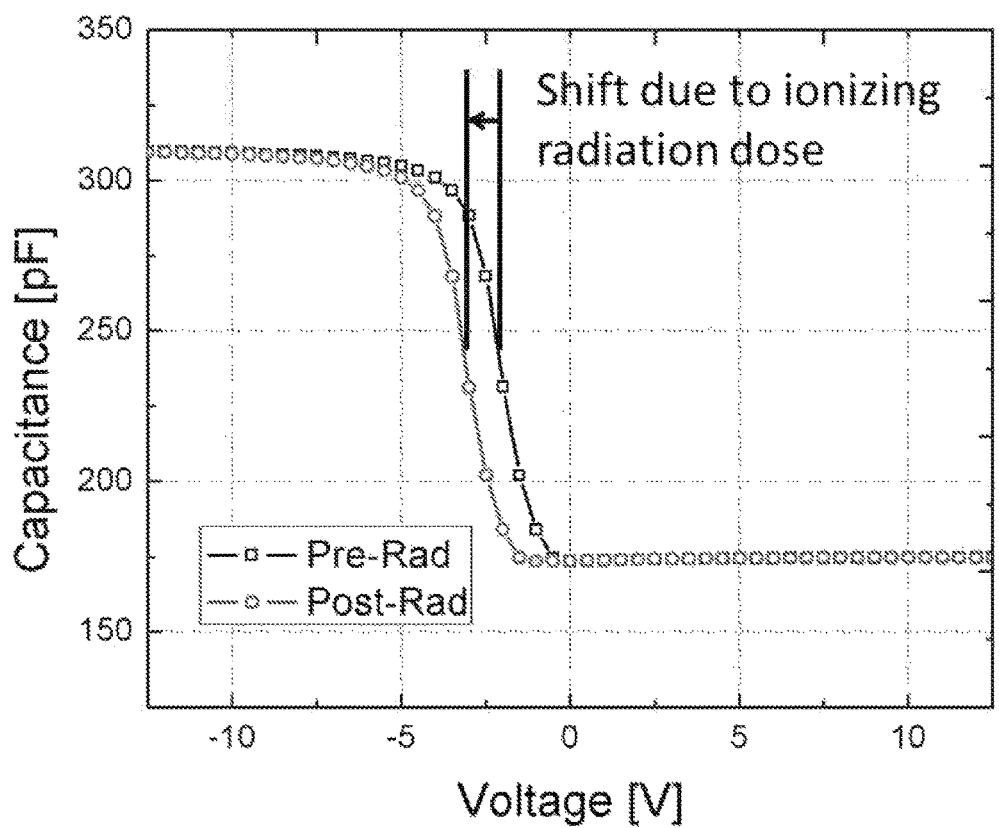
FIG. 3 is a graph illustrating the radiation-induced capacitance response of a radiation-sensitive MOSCAP represented by a shift in the C-V response of the device, according to one embodiment of the present invention.

The interaction of semiconductor and insulating solids with radiation is understood as the creation of electron hole pairs (e-h) through ionization of individual atoms by primary and secondary particles. Subsequent to their creation, these charges can either recombine in the material, discharge through conduction, or become trapped. If charges are trapped and, therefore, present in the oxide, they too can change the semiconductor depletion region width in the same way the gate voltage can. Any increase in oxide charge density will affect the semiconductor depletion region width, which results in a capacitance change. Trapped positive charges create an electric field in the oxide, and appear as an added positive gate voltage. This results in an increasingly negative threshold voltage and a negative voltage shift in the C-V response curve of the MOSCAP device, as Illustrated in FIG. 3. Therefore the trapping of positive charges (holes) in the oxide layer created by the interaction of ionizing radiation and the oxide results in a radiation-induced capacitance response in the MOSCAP.

Following the radiation-induced electron-hole pair generation in the radiation-sensitive oxide layer of a MOSCAP sensor, the amount of initial recombination and hence annihilation of liberated charge is highly dependent on the electric field in the oxide and the energy and type of incident particle. In general, strongly ionizing particles form dense columns of charge where the recombination rate is relatively high. On the other hand, weakly ionizing particles generate relatively isolated charge pairs, and the recombination rate is lower.

Figure 4:
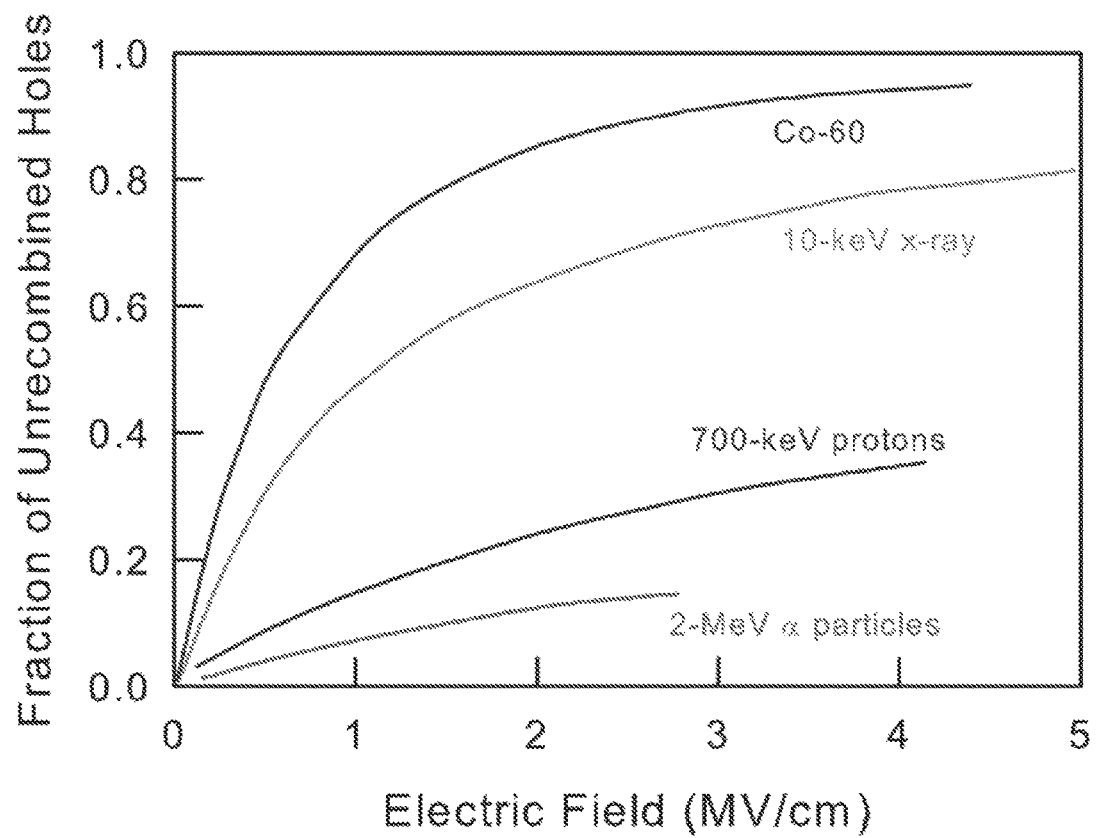
FIG. 4 is an illustration depicting the fraction of un-recombined holes as a function of the external bias voltage, according to one embodiment of the present invention.

The dependence of initial recombination on the electric field strength in the oxide for low-energy protons, alpha particles, gamma rays (Co-60), and x rays is illustrated in FIG. 4. Plotted in FIG. 4 is the fraction of un-recombined holes, also referred to as charge yield (liberated charges, as a result of absorbed radiation, that will actually contribute to the radiation response of the device) versus electric field in the oxide. For all radiation types, as the electric field strength increases, the probability that a hole will recombine with an electron decreases, and the fraction of un-recombined holes increases.

Figure 5:
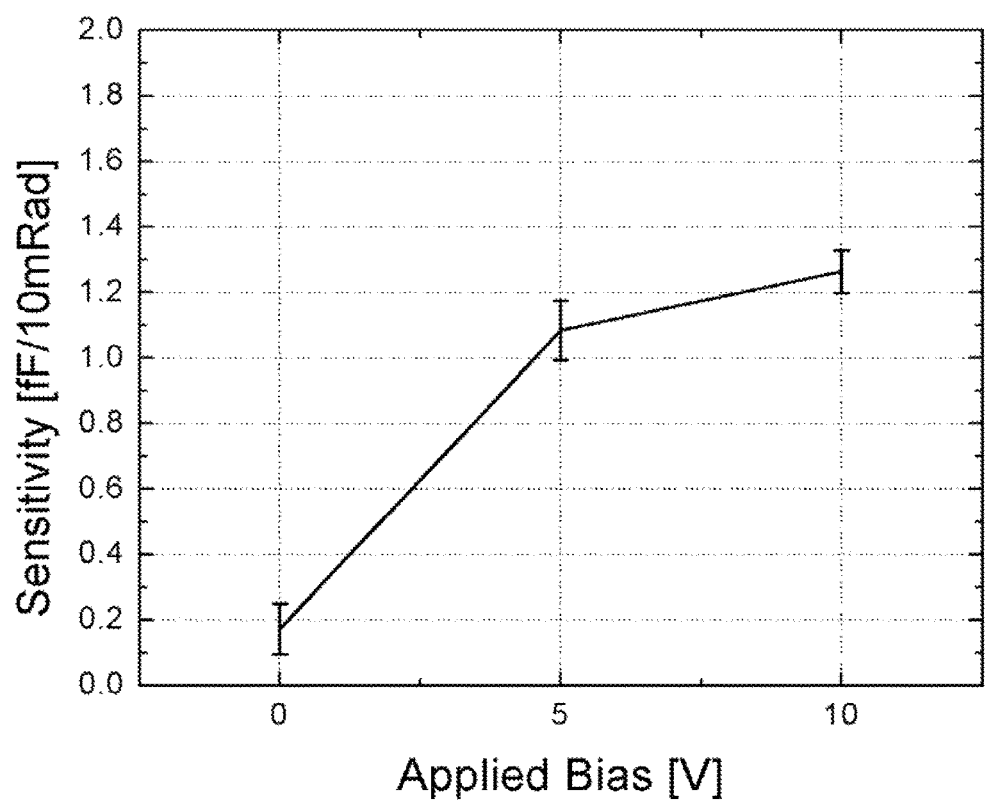
FIG. 5 is an illustration of the sensitivity of the radiation-induced capacitance response, associated with a radiation-sensitive MOSCAP, as a function of applied external bias voltage, according to one embodiment of the present invention.

Disclosed embodiments provide application of an external bias across the MOSCAP device increases the strength of the electric field that accelerates the liberated hole and electron pairs in opposite direction, thus impeding their recombination at the site of radiation absorption within the oxide. This is illustrated for the radiation-sensitive externally biased MOSCAP structure in FIG. 1. The efficiency of positive charge collection at the substrate/oxide (Si/SiO$_2$) interface where majority of hole trapping sites reside will, therefore, increase in response to the applied positive bias across a radiation-sensitive MOSCAP resulting in a greater shift in capacitance in response to absorbed radiation. This results in an enhanced radiation-induced capacitance response sensitivity. Capacitance response sensitivity as a function of applied bias is illustrated in FIG. 5. According to measured data presented in FIG. 5, a base-line sensitivity of 1.1 fF/mrad is established with applied external bias of 5V, in accordance with one embodiment of the present invention.

As discussed above, an absorbed radiation dose in the oxide layer of a MOS Si/SiO$_2$ device can more precisely be quantified by measurement of the change in the capacitance parameter in a MOSCAP device rather than the change in the threshold voltage parameter in a MOSFET device. The former yields significantly better resolution due to a greater precision of the available capacitance electronic measurement methodologies. Moreover, application of bias voltage across the radiation-sensitive oxide layer, in accordance with disclosed embodiments, can also increase the sensitivity of MOSCAP radiation response as illustrated in FIG. 4 and FIG. 5. Further enhancement of device radiation response sensitivity and resolution is achievable by controlling the device structural and process parameters. Three such parameters that can be selected to optimize the performance of the detector as a radiation dosimeter are the oxide thickness, the post-oxidation annealing time and temperature parameters.

The post-oxidation annealing (POA) temperature plays an important role in the buildup of oxygen vacancies, which is the primary type of defect responsible for oxide trapping of holes. This is attributed to the out-diffusion of oxygen at high temperatures, thus, leaving behind oxygen vacancy defects. High POA temperatures result in vacancies that lead to significantly increased radiation-induced oxide charge buildup.

Figure 6:
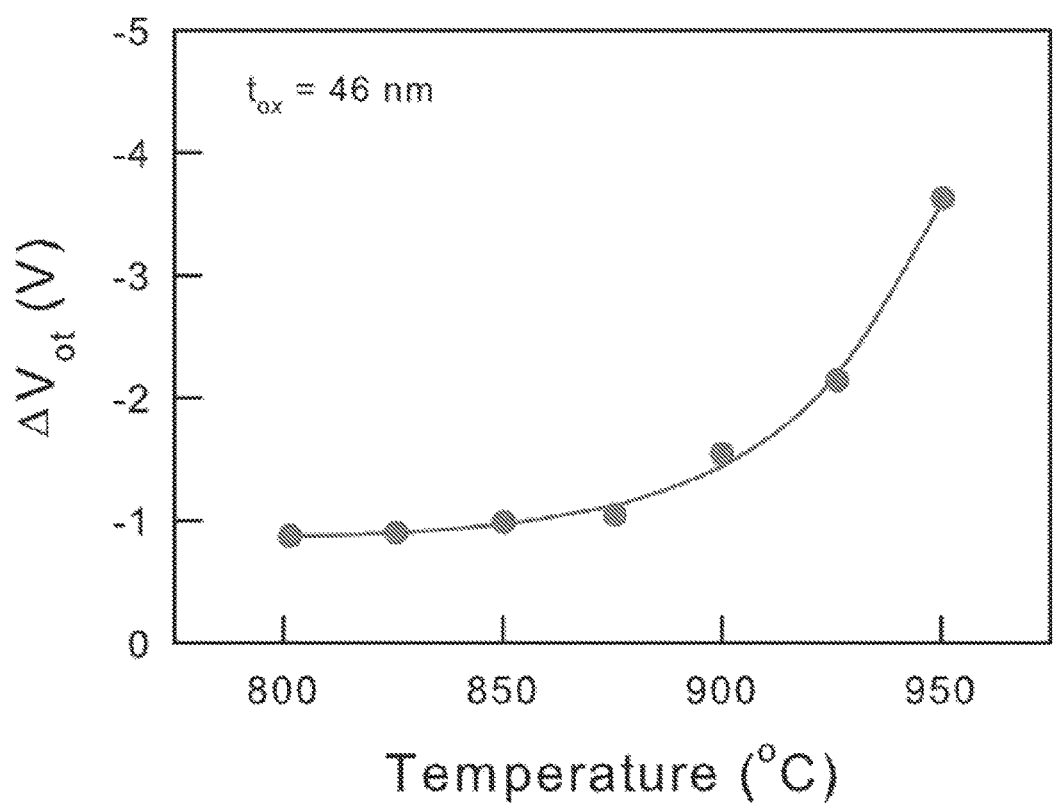
FIG. 6 is a graph illustrating the radiation sensitivity of a radiation-sensitive MOSCAP represented as the amount of radiation-induced shift in the device threshold voltage parameter as a function of the POA temperature, according to one embodiment of the present invention.

In one embodiment, radiation-sensitive MOSCAP with enhanced radiation sensitivity are fabricated at POA temperature of 1100° C. and compared with a radiation-sensitive MOSCAP structures with base-line radiation sensitivity fabricated at a POA of 400° C. The high temperature POA is expected to create an excess of hole traps in the SiO$_2$. The increase in hole traps resulting from high temperature POA expectedly leads to greater deviation in a radiation-induced shift in a MOSCAP's capacitance parameter which is a real-time measure of the absorbed radiation dose in the MOSCAP's radiation-sensitive oxide layer. This information may be gathered and subsequently processed, for example, in a computer system for further analysis. For example, described embodiments may provide saving a value of the absorbed radiation dose, for example, to a non-transient storage medium and/or displaying the value of the absorbed radiation dose to a user. The enhanced sensitivity exhibited by MOSCAP devices fabricated at high POA temperatures, in accordance to one aspect of the present invention, is illustrated by the measured data in FIG. 6. This embodiment presents a factor of four increase in the radiation-induced threshold voltage shift when the temperature parameter associated with the POA fabrication step is increased from 800° C. to 950° C. Furthermore, a voltage shift increase of a factor of 20 is achieved by increasing the POA temperature from 800° C. to 1200° C.

Figure 7:
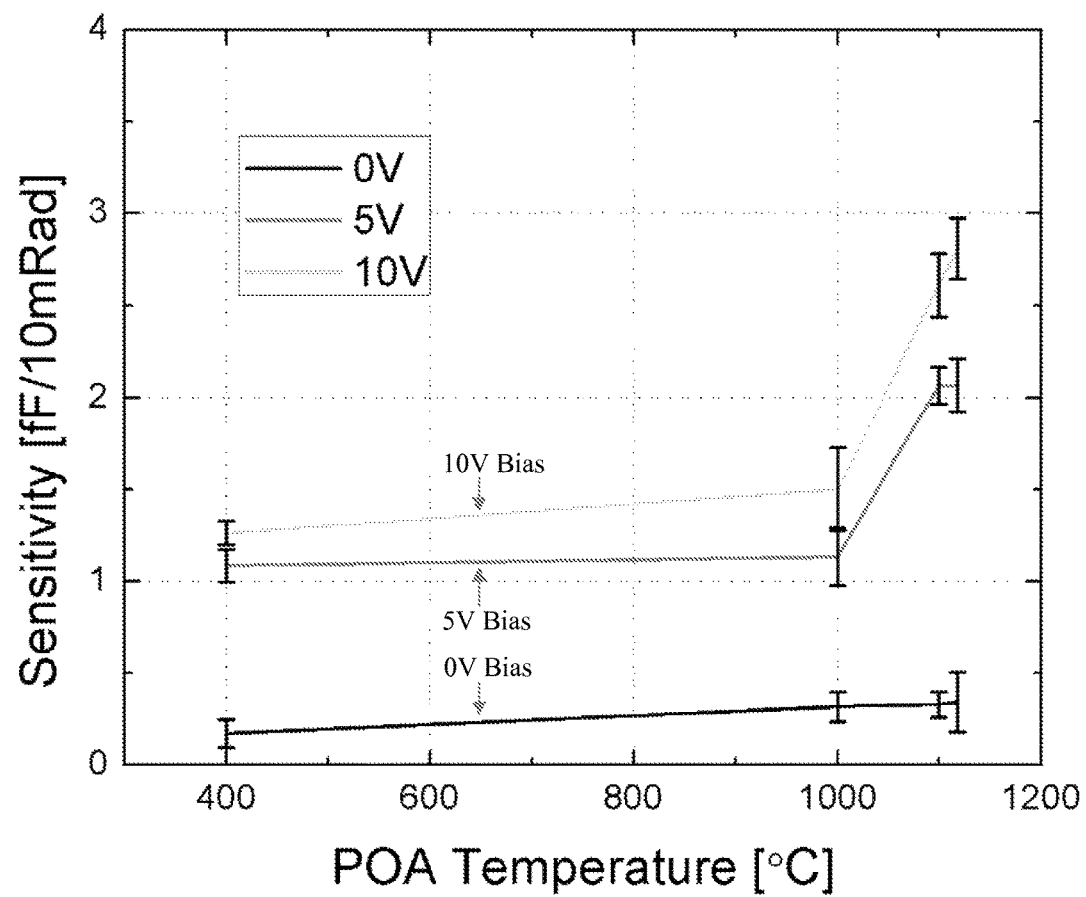
FIG. 7 is a graph illustrating the radiation-induced capacitance response sensitivity as a function of the POA temperature for three different values of external bias voltage applied across the radiation-sensitive MOSCAP, according to one embodiment of the present invention.

FIG. 7 illustrates radiation sensitivity in terms of change in capacitance as a function of the POA temperature, measured for a unbiased radiation-sensitive MOSCAP, a radiation-sensitive MOSCAP biased at 5V and a radiation-sensitive MOSCAP biased at 10V. As expected, higher POA temperatures increase sensitivity of radiation-induced capacitance response in radiation-sensitive MOSCAPs.

Figure 8:
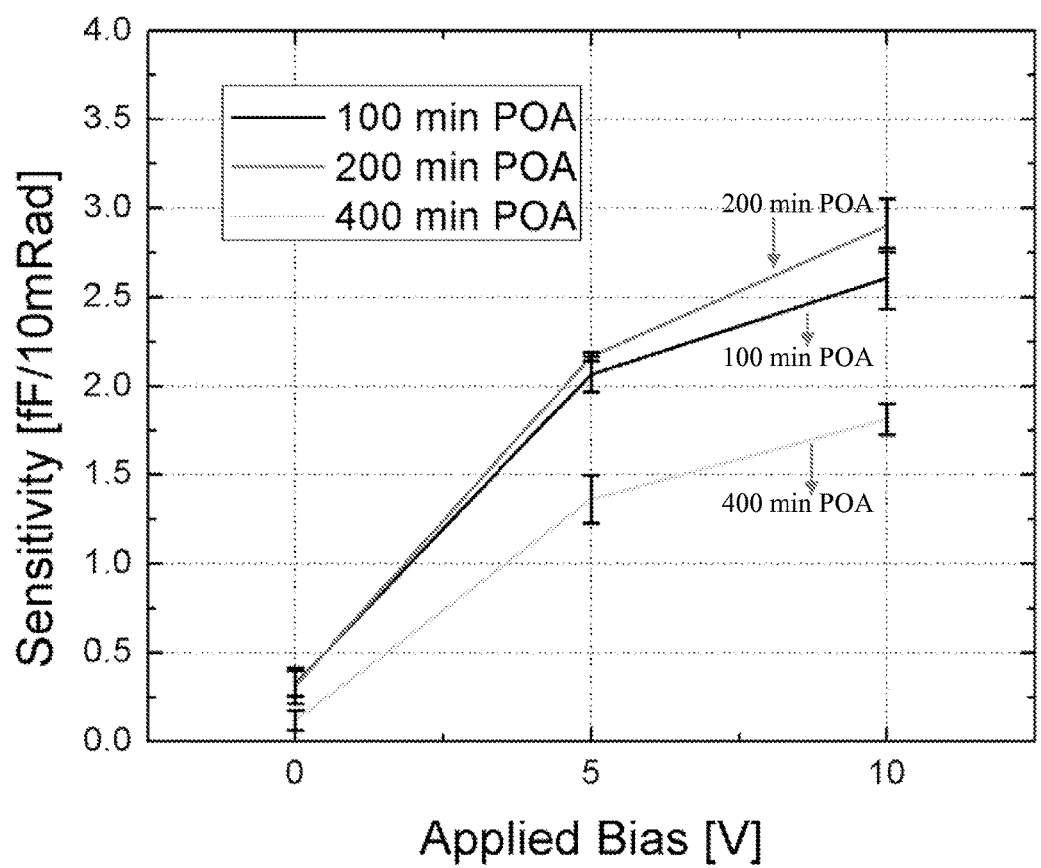
FIG. 8 is a graph illustrating the radiation-induced capacitance response sensitivity as a function of the external bias applied across the radiation-sensitive MOSCAP, measured for three different values of POA time parameter, according to an embodiment of the present invention.

FIG. 8 illustrates radiation sensitivity in terms of MOSCAP capacitance response measured as a function of the applied BIAS voltage at three different time parameters associated with the POA fabrication step. As observed from FIG. 8, longer POA times have a small effect on improving sensitivity, however above 200 minutes, the sensitivity starts to significantly decrease due to the reduction in the rate of change of MOSCAP capacitance with respect to the applied voltage. Therefore optimal results, in accordance to one aspect of the present invention, are associated with POA time parameters within a range of approximately 100-200 minutes.

In accordance to one aspect of the present invention, POA conducted at approximately 1100° C. for approximately 100 min in N2 results in near 100% trapping of the radiation-generated holes, increasing the radiation sensitivity of the respective MOSCAP, biased at 5V, by a factor of 2. At this point further improvement in sensitivity will be limited by the number of radiation-generated holes within the oxide. Therefore, increasing the sensitivity further requires a thicker oxide which will allow for the creation of more radiation-generated holes, which can fill the excess traps.

Figure 9:
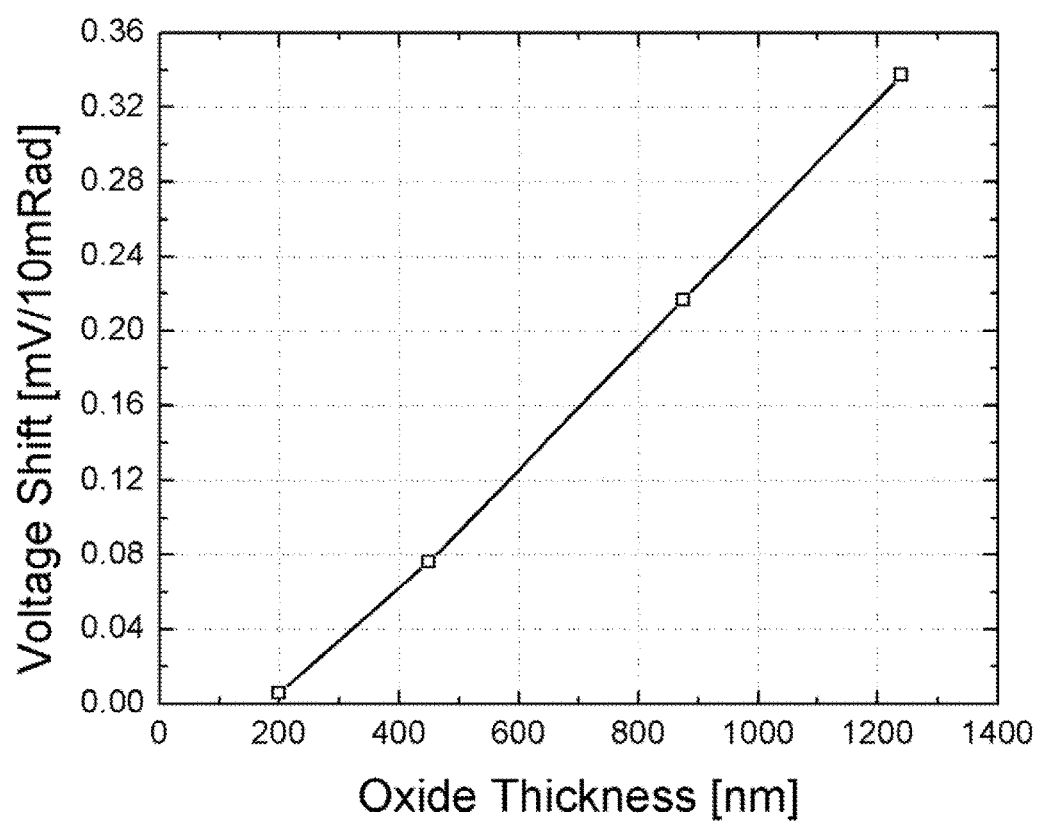
FIG. 9 is an illustration of the radiation-induced shift in the threshold voltage parameter as a function of the oxide layer thickness in a radiation-sensitive MOSCAP, according to one embodiment of the present invention.

FIG. 9 is an illustration of the radiation-induced shift in the threshold voltage parameter as a function of the oxide layer thickness in a radiation-sensitive MOSCAP, according to one embodiment of the present invention. If the oxide electric field is held constant, the sensitivity increases with the square of Oxide thickness ($t_{ox}^2$). However, if the oxide is unbiased then the sensitivity can no longer be assumed to be proportional to the square of the oxide thickness, because the sensitivity is now dominated by the intrinsic electric field of the pre-existing charged oxide defects and contact potential between the gate (Top conductive layer) and semiconductor (bottom conductive layer). The threshold voltage shift due to both charges decreases with a slightly less than a $t_{ox}^2$, dependence. For oxides thinner than 20 nm, sensitivity drop-off (in terms of the density of radiation-generated oxide-trapped charges whose amount decreases with an even faster dependence on Oxide thickness) is much more severe than $t_{ox}^2$ dependence. Thicker oxide results in larger voltage shift due to greater number of present oxide traps as well as the greater number of electron-hole pairs generated due to the increased volume available for the absorption of the incident radiation.

Figure 10:
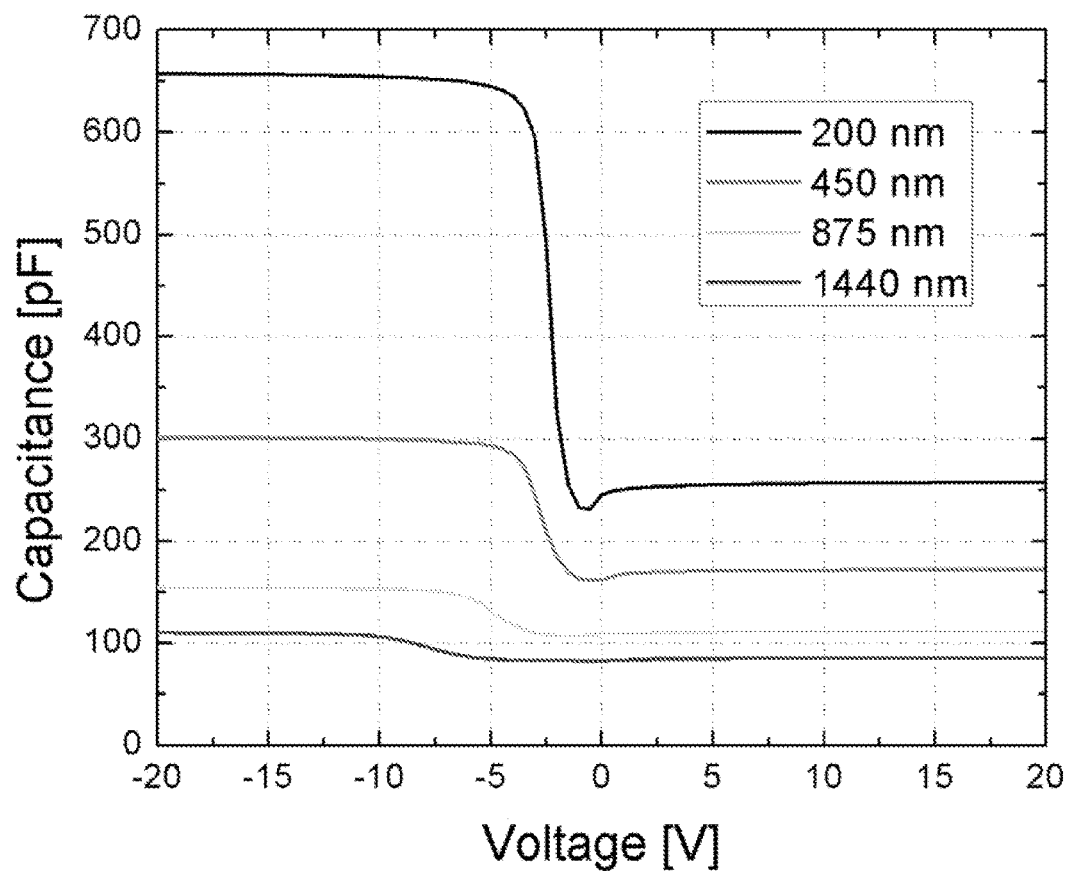
FIG. 10 is an illustration of the C-V response as a function of applied bias voltage for radiation-sensitive MOSCAP for varying oxide layer thickness values ranging from 200 nm to 1440 nm, according to one embodiment of the present invention . . . .
Figure 11:
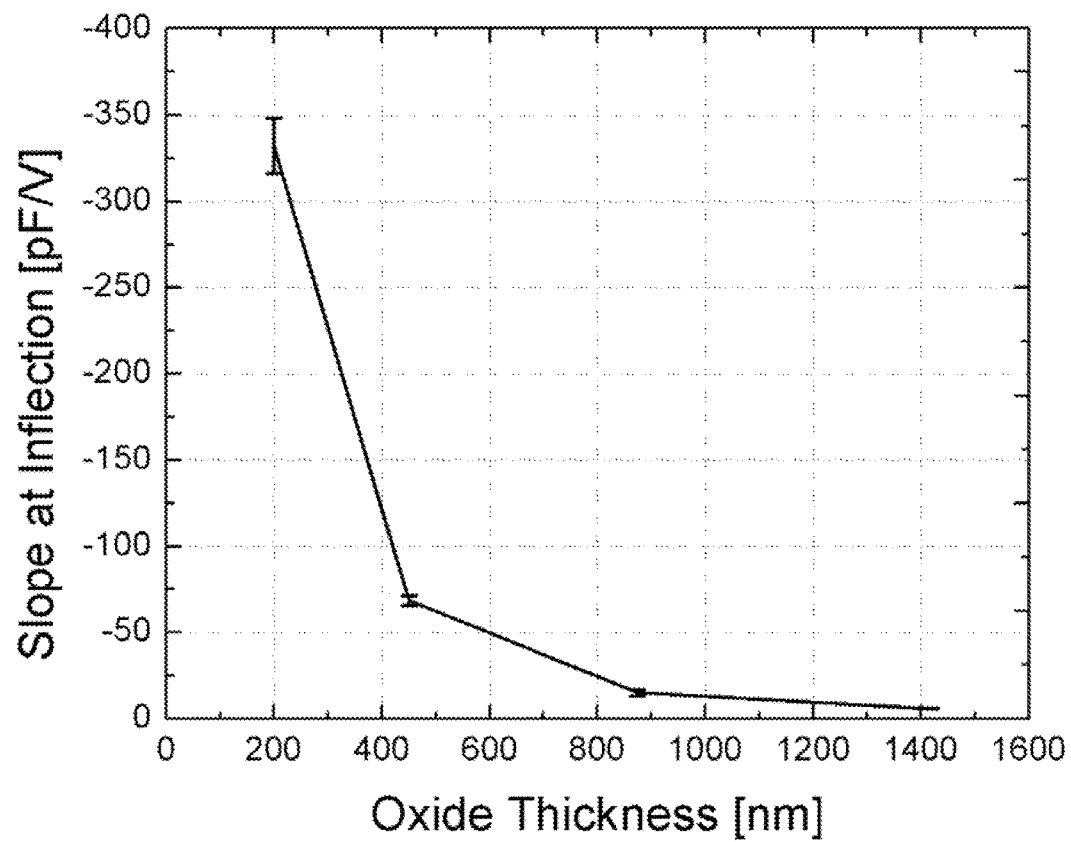
FIG. 11 is a graph illustrating the rate of change of radiation-induced capacitance response as a function of oxide layer thickness, according to one embodiment of the present invention.
Figure 12:
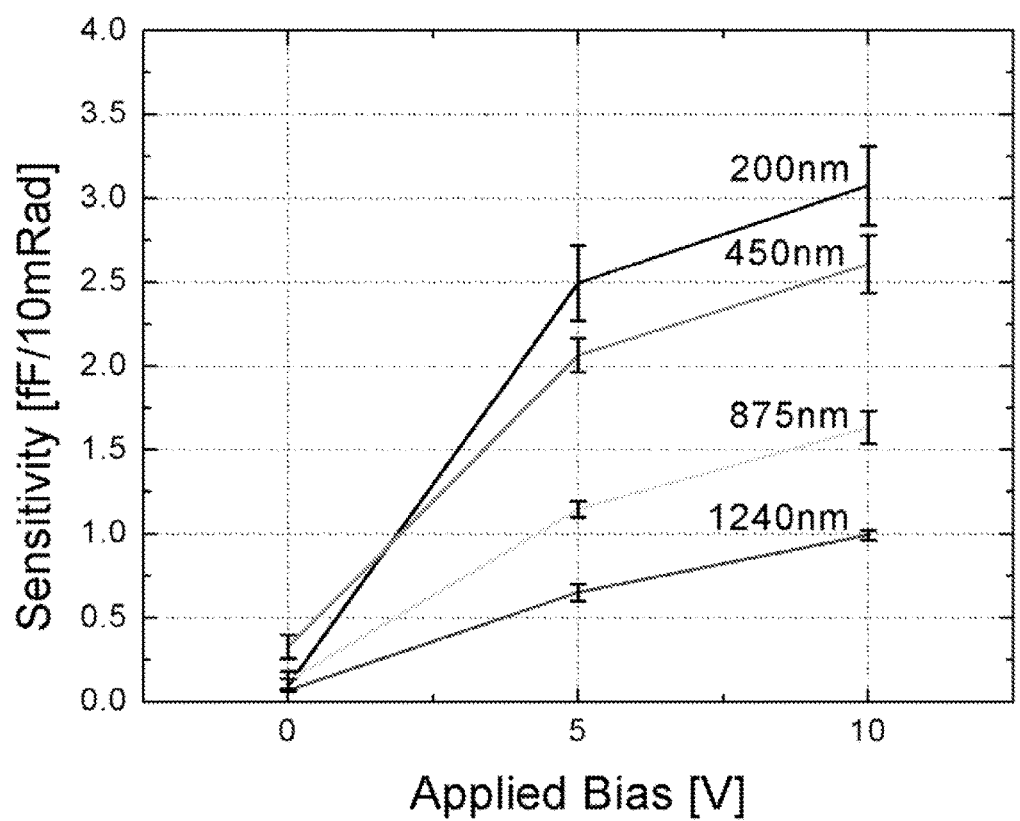
FIG. 12 is an illustration of the radiation-induced capacitance response sensitivity for a radiation-sensitive MOSCAP as a function of the applied bias measured for different thickness values of the oxide layer, according to one embodiment of the present invention.

However, as the oxide thickness increases, so does the gate voltage required to maintain a constant electric field. The measured data in FIG. 10 (representing the C-V response curve for MOSCAPs with different oxide thickness values) shows an inverse relationship wherein the slope of the C-V response curve decreases as the oxide layer thickness is increased. FIG. 11 demonstrates the slope of the C-V response curves in FIG. 10 as a function of gate oxide thickness at their respective inflection points. It is observed that the slope increases significantly for thinner oxides. Determining the radiation-induced capacitance response sensitivity of the MOSCAPs with different oxide thickness values requires multiplying the voltage shift values for the corresponding MOSCAPs from FIG. 9 by the inflection slope of the corresponding C-V response curves from FIG. 11 (rate of change capacitance with respect to voltage). FIG. 12 illustrates the resulting radiation-induced capacitance response sensitivity of the MOSCAP sensors with increasing oxide layer thickness parameters ranging from 200 nm to 1240 nm. According to the measurements shown in FIG. 12, the largest capacitance shift is actually obtained with thinnest oxide.

Figure 13:
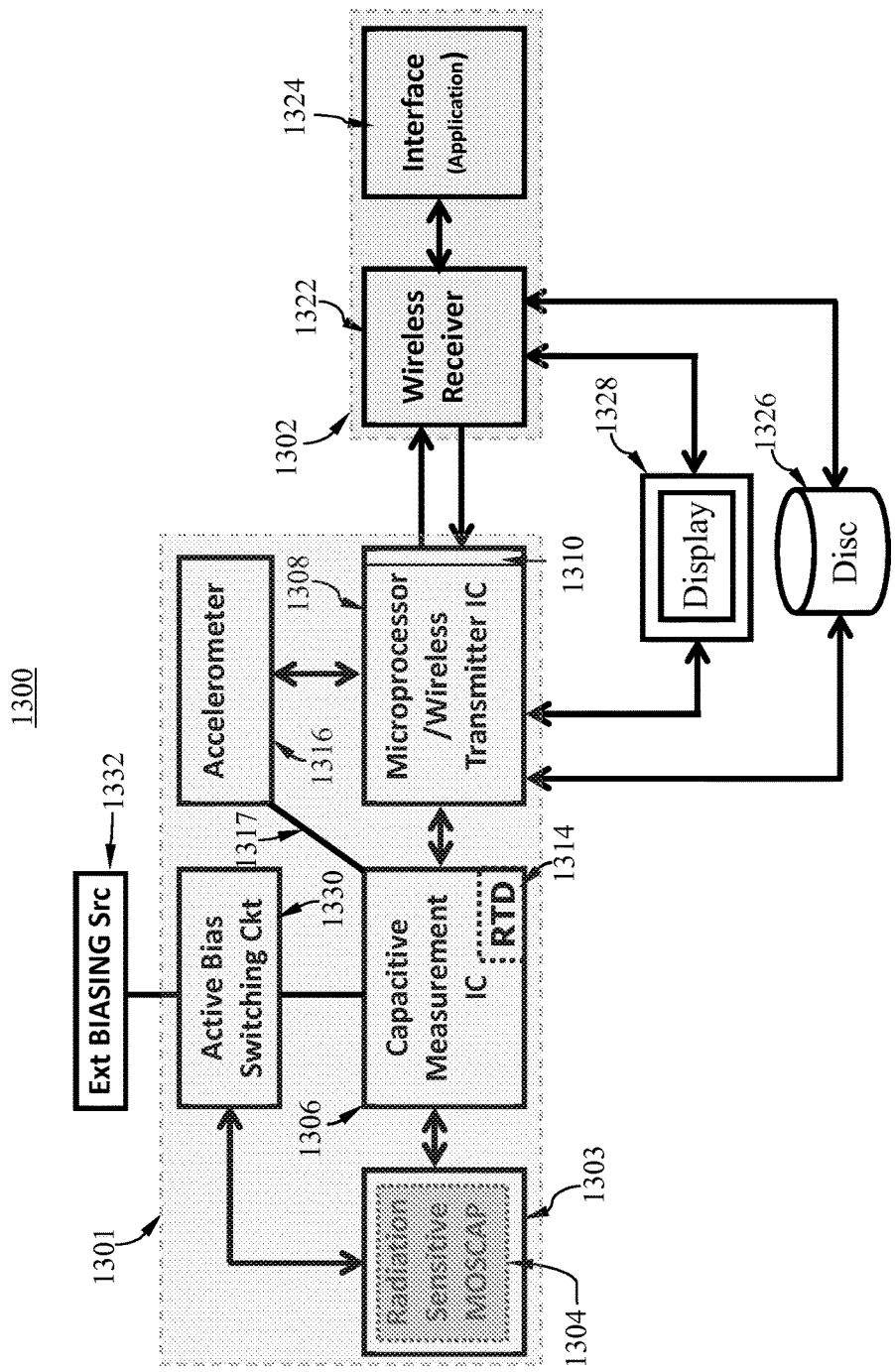
FIG. 13 is diagram illustrating the main functional units in a solid-state MOSCAP-based dosimeter system with real-time wireless radiation-dose reporting capability, according to one embodiment of the present invention.

FIG. 13 illustrates an exemplary solid-state dosimeter system 1300, in accordance to one embodiment of the present invention. The solid-state dosimeter system 1300 may comprise a front-end sensing/processing unit 1301 comprising of one or more on-board radiation sensing and signal processing elements and a far-end processing/reporting unit or a base station 1302. The front-end sensing/processing unit 1301 may comprise one or more capacitive sensing elements 1303 such as, for example, one or more radiation-sensitive MOSCAPs 1304. The front-end sensing/processing unit 1301 may also comprise a capacitive readout IC 1306 coupled to the one or more radiation-sensitive MOSCAPs 1304 for real-time measurement and digitization of the radiation-induced capacitance response in one or more radiation-sensitive MOSCAPs 1304. In some embodiments the front-end sensing/processing unit 1301 may further comprise a microprocessor/wireless transceiver integrated circuit (IC) 1308 for storage, processing and wireless transmission of the digital capacitance values provided by the capacitive readout IC 1306. The microprocessor/wireless transceiver IC 1308 may include a Bluetooth® controller (antenna transceiver) 1310 for establishing a Bluetooth® link to the far-end processing/reporting unit or base station 1302 to thereby enable automatic uploading of the radiation dose information, when the front-end sensing/processing unit 1301 is in proximity of the base station 1302. The front-end sensing/processing unit 1301 may further comprise additional functionality such as, for example, temperature sensing, for providing the necessary temperature measurements that may be used to compensate for the temperature induced drift in the measurement of the radiation-induced capacitance response in one or more radiation-sensitive MOSCAPs and a motion detection functionality for wake up operation and for verifying user presence during radiation exposure.

In the exemplary solid-state dosimeter system 1300, temperature sensing functionality may be provided by a resistive temperature detector (RTD) 1314. RTD element 1314 exhibits a predictable change in resistance as the temperature changes, therefore temperature sensing may be implemented by correlating the resistance of the RTD element 1314 with the operating temperature of the one or more radiation-sensitive MOSCAPs 1304.

In the exemplary solid-state dosimeter system 1300, motion detection functionality may be provided by an accelerometer 1316. In one embodiment of the present invention the accelerometer 1316 may comprise a microscopic crystal structure that exhibits a piezoelectric effect such that when the crystal structure is stressed by accelerative forces, it generates a voltage. In another embodiment accelerometer 1316 may sense changes in capacitance, for example, it may comprise two microstructures next to each other, having a certain capacitance between them. If an accelerative force moves one of the structures, then the capacitance between them will change. In such a case, the capacitive readout IC 1306 may be utilized to convert the capacitance change, detected across connection 1317, to a voltage value to thereby implement accelerometer functionality. This would be relevant in occupational dosimetry applications wherein the front-end sensing/processing unit 1301 of the solid-state dosimeter system 1300 may be implemented as a portable or wearable device. The data from the accelerometer 1316 may be used in conjunction with the radiation dose data from the capacitive readout IC 1306 and the microprocessor/wireless transceiver IC 1308 in order to indicate whether the front-end sensing/processing unit 1301 was carried by, worn by or attached to a user during radiation exposure. In select embodiments, the temperature and acceleration data may also be transmitted, for example, to the base station 1302 for further data processing, conditioning, interpretation or evaluation.

It is not the intention of the forgoing description or figures to place any restriction on the methodology utilized for generating the motion data that may be indicative of user operation during radiation exposure. As such, it should be noted that alternative means of generating motion data may be employed by the solid-state dosimeter system without departing from the scope of the present invention.

The far-end processing/reporting unit or the base station 1302 may comprise a wireless receiver 1322 and an application interface 1324. The wireless receiver 1322 may serve as a radio frequency (RF) signal interface for establishing a reliable wireless link with a RF transmitting element such as, for example, Bluetooth® low energy (BLE) controller or antenna transceiver 1310 that may be implemented on the front-end sensing/processing unit 1301, to thereby enable wireless exchange of information with the front-end sensing/processing unit 1301. The information received by the wireless receiver 1322 may then be processed by the application interface 1324 for user intended reporting and administration.

In select embodiments of the present invention, the relevant environmental data, such as, for example, the absorbed radiation dose, the ambient or sensor temperature data and the motion or acceleration related data, may be stored to a non-transient storage medium 1326 and/or displayed to a user on a visual display device 1328.

In accordance to one aspect of the present invention, select embodiments of the exemplary solid-state dosimeter system 1300, may comprise a front-end sensing/processing unit 1301 wherein the one or more radiation-sensitive MOSCAPs 1304 may be switchingly coupled to the capacitive readout IC 1306 across an active bias switching circuit 1330. The active bias switching circuit 1330 may alternate from applying an external bias 1332, for enhancing the radiation-induced build-up of positive charge (hole) density at the Si/SiO$_2$ interface, hence enhancing the capacitance response of the one or more radiation-sensitive MOSCAPs 1304, to removing the external bias 1332. The active bias switching circuit 1330 may also serve to connect the one or more radiation-sensitive MOSCAPs 1304 to the capacitive readout IC 1306 for performing a measurement of the radiation-induced capacitance response (shift in capacitance as a result of the radiation-induced buildup of oxide-trapped hole density at the Si/SiO$_2$ interface) generated by the one or more radiation-sensitive MOSCAPs 1304.

Accordingly, application of a positive bias voltage result in increased oxide trapped hole buildup near the Si/SiO$_2$ interface in an irradiated MOSCAP device. The number of oxide trapped holes near the Si/SiO$_2$ interface yields a negative shift in threshold voltage which appears as an effective equivalent increase in the positive voltage drop across the MOSCAP. In order to exploit the superior sensitivity and measurement resolution associated with capacitance measurement and readout electronics, the measurable capacitance response resulting from the radiation-induced shift in the threshold voltage may be used as a MOSCAP output response. However, MOSCAP capacitance response, when measured in the inversion operating region, exhibits no measurable response to radiation as can be seen from the exemplary post-radiation and pre-radiation C-V response curves 1400, measured for a p-substrate implemented radiation-sensitive MOSCAP in FIG. 14.

On the other hand, the capacitance in the depletion region (specifically in the vicinity of the inflection point 1402 on the C-V response curve) changes significantly. Therefore, in order to optimize measurement resolution, it is desirable to measure the capacitance of the radiation-sensitive MOSCAP in the depletion region of operation preferably at or near the inflection point 1402. The optimal measurement region is marked with a solid line 1404 in FIG. 14.

Figure 14:
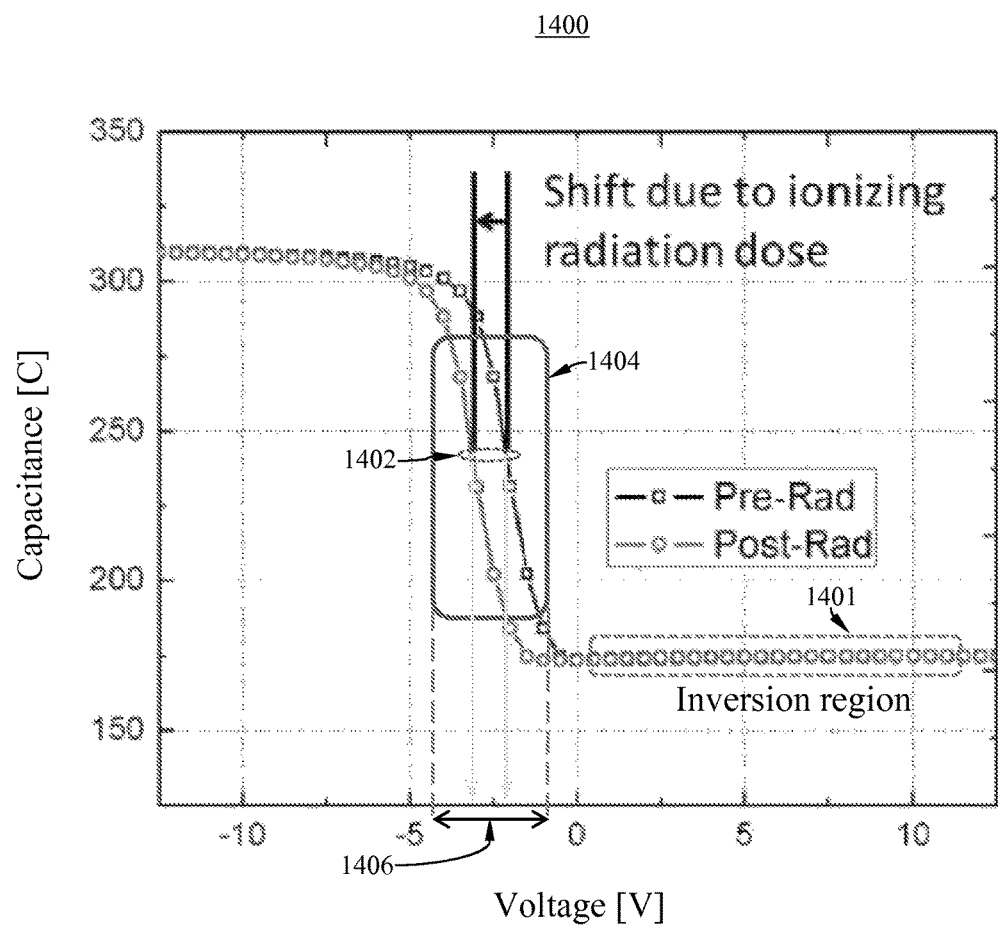
FIG. 14 is a graph illustrating the distinction between the radiation-sensitive MOSCAP operation regime during biasing operation and measurement operation to maximize sensitivity, according to one embodiment of the present invention. Integrated Circuit( )

In the case of the exemplary p-substrate implemented MOSCAP of FIG. 14, the application of a positive external bias to increase the rate and density of the radiation-induced hole build up near the Si/SiO$_2$ interface may place the MOSCAP in the inversion region 1401, as illustrated in FIG. 14. Measurement of the MOSCAP capacitance response induced by the radiation-induced charge buildup near Si/SiO$_2$ interface, post external bias application, may require shifting the operating point of the MOSCAP device into the depletion region prior to measuring the induced capacitance response.

Accordingly, in order to enable capacitance measurement within the optimal measurement region (depletion region) 1404, the voltage supply (Vdd) of the capacitive readout IC 1306 is chosen such that Vdd to ½(Vdd) voltage magnitude range falls within the depletion voltage range 1406 associated with the optimal measurement region (depletion region) 1402. In order to account for the negative polarity of the depletion voltage range 1406 in the optimal measurement region 1404, the measurement must be taken in a direction opposite to that of the bias application. The active bias switching circuit 1330 is configured accordingly to reverse the connection polarity of a p-substrate implemented radiation-sensitive MOSCAP between capacitance measurement and bias application such that biasing voltage is applied to the gate electrode of a p-substrate implemented radiation-sensitive MOSCAP while measurement is taken from the body (substrate) electrode of a p-substrate implemented radiation-sensitive MOSCAP.

Figure 15:
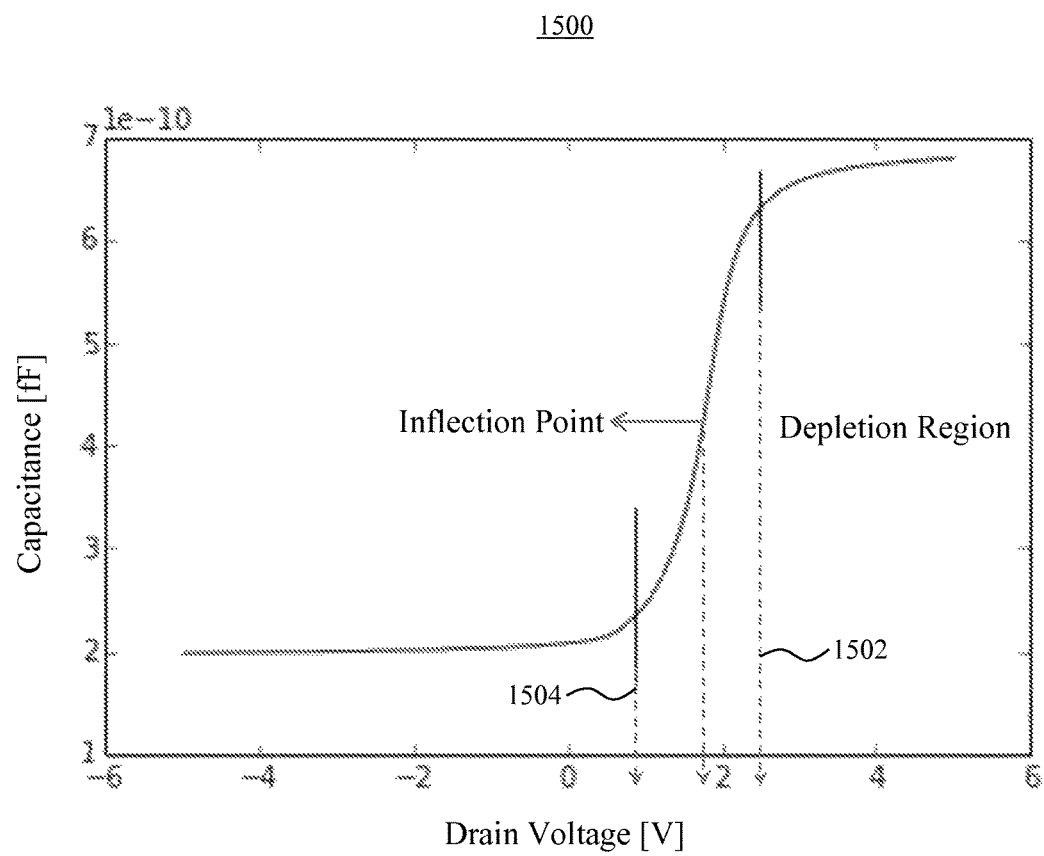
FIG. 15 is an illustration of the optimal capacitance-voltage response of the radiation-sensitive MOSCAP during capacitance measurement operation, according to one embodiment of the present invention.

The corresponding C-V trace 1500 associated with the measurement cycle is shown in FIG. 15. The depletion region, as shown on C-V trace 1500 is confined between the between the high-end voltage value 1502 and low-end voltage value 1504. The high-end voltage value 1502 corresponds approximately to the supply voltage (Vdd) of the capacitive readout IC 1306 and is selected as approximately 2.8 V in accordance to one embodiment of the present invention. The low-end voltage value 1504 corresponds to the threshold voltage (V$_{th}$) of the capacitive device (i.e. radiation-sensitive MOSCAP or reference capacitor) in accordance to one embodiment of the present invention.

Figure 16:
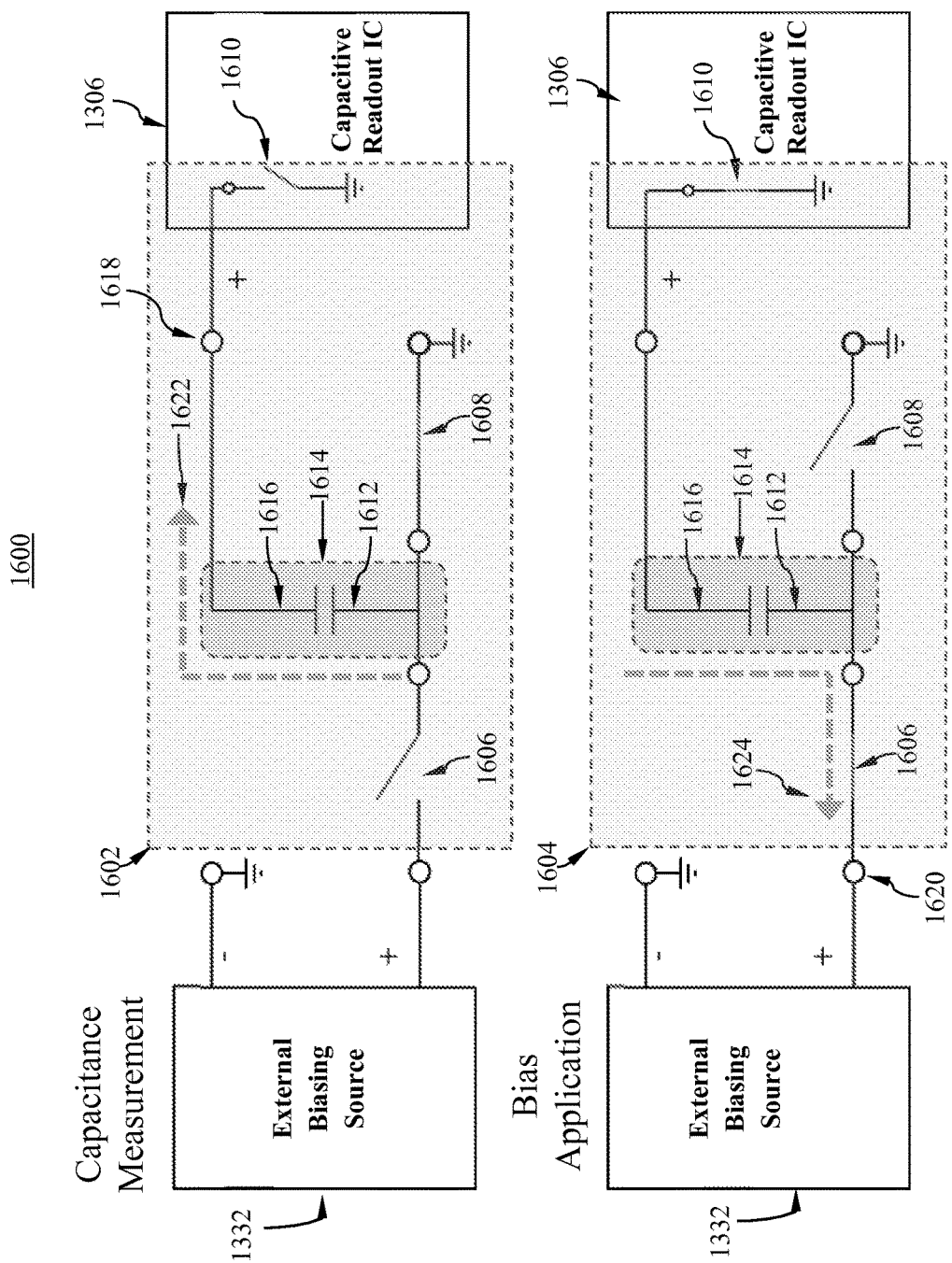
FIG. 16 is a schematic illustrating radiation-sensitive MOSCAP connectivity through the active biasing switch with capacitive readout IC and external bias source, according to one embodiment of the present invention.

FIG. 16 illustrate the connectivity pattern 1600 established by the active bias switching circuit 1330 during the capacitance measurement and bias application cycles. The connectivity pattern 1600 is characterized by a switching configuration 1602 and 1604 established by controlling the state of switches 1606, 1608 and 1610. In the switching configuration 1602, switch 1606 and 1610 are open while switch 1608 is closed thereby grounding the top conducting layer (gate) 1612 of the radiation-sensitive MOSCAP 1614 while connecting the bottom conducting layer (substrate/body) 1616 of the radiation-sensitive MOSCAP 1614 to the positive terminal 1618 of the capacitive readout IC 1306. In the switching configuration 1604, switch 1608 is open while switch 1606 and 1610 are closed thereby connecting the top conducting layer (gate) 1612 of the radiation-sensitive MOSCAP 1614 to the positive terminal 1620 of the external biasing source 1332 while grounding the bottom conducting layer 1616 of the radiation-sensitive MOSCAP 1614 through the capacitive measurement IC 1306. As illustrated in FIG. 16, the connection polarity during the capacitance measurement cycle as indicted by 1622 is opposite that of the bias application cycle as indicated by 1624.

Figure 17:
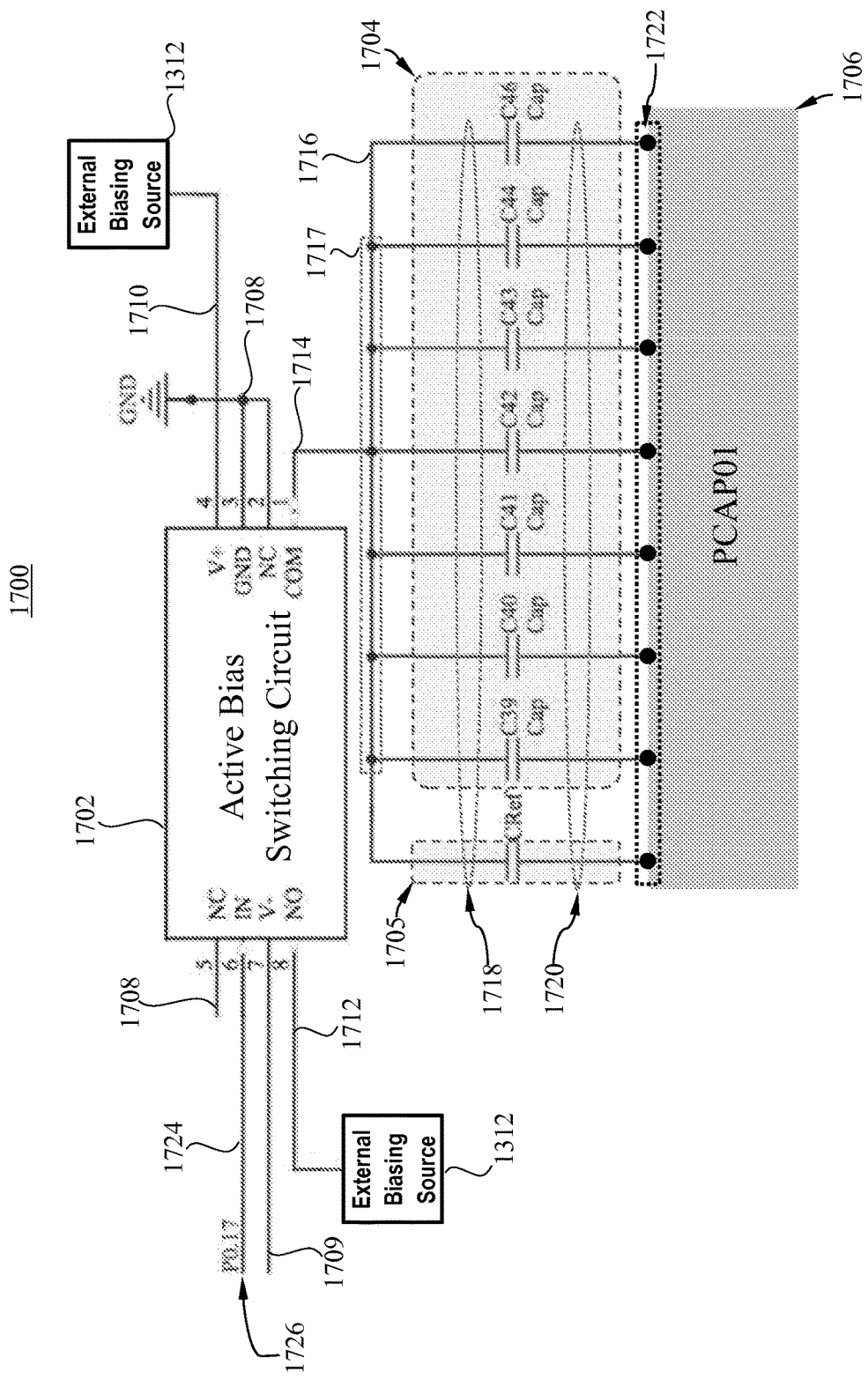
FIG. 17 is a basic block diagram illustration of an active biasing switch for coupling the radiation-sensitive MOSCAP alternately to the biasing and measurement nodes, according to one embodiment of the present invention.

FIG. 17 illustrates the connectivity profile 1700 between the active bias switching circuit 1702, one or more radiation-sensitive MOSCAPs 1704, reference capacitor 1705 and the capacitive readout IC represented by PCAP01 IC 1706. Active bias switching circuit 1702 comprises No-Connect ports 1708 that are left unconnected in one instance and tied to the ground terminal (GND) in another instance as illustrated in FIG. 17. Port 1709, designated for connection to a negative rail voltage, is also left unconnected according to the exemplary connectivity profile 1700. Furthermore, in the exemplary connectivity pattern 1700, port connection 1710 and 1712 are connected to the external biasing source 1312. Input/output port 1714 is connected to common node 1716 formed by shorting together the conducting contacts 1717 of the top conducting layers 1718 of the one or more radiation-sensitive MOSCAPs 1704. The bottom conducting layers 1720 of the one or more radiation-sensitive MOSCAPs 1704 are connected to the capacitive measurement ports 1722 of the capacitive readout IC (PCAP01 IC) 1706. Input port 1724 of the active bias switching circuit 1702 is connected to a digital output 1726 coming from microprocessor/wireless transceiver IC 1308.

Figure 18:
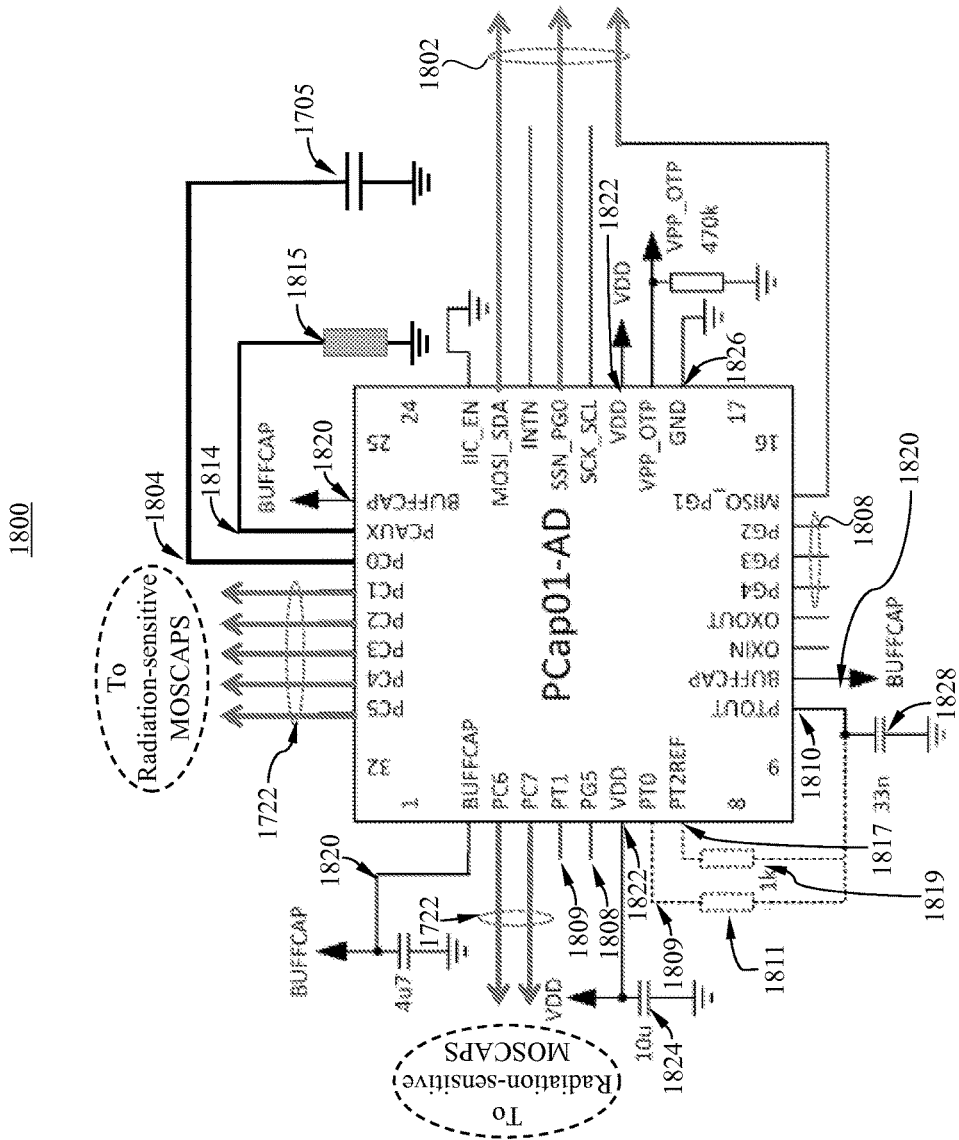
FIG. 18 is an illustration of an exemplary capacitance measurement and readout SoC comprising a Capacitance to Digital Converter IC, according to one embodiment of the present invention.

A select embodiment of the earlier described capacitive readout IC 1306 is illustrated in FIG. 18. Here, an application of the aforementioned capacitive readout IC 1306 is employed as a PCAP01 IC 1800. PCAP01 IC 1800 comprises capacitive measurement ports 1722 for connection to the one or more radiation-sensitive MOSCAPs 1704, capacitive output ports 1802 for outputting a value for the radiation-induced capacitance response of the one or more radiation-sensitive MOSCAPs 1704, along with a temperature value that is outputted along with the capacitance data, port connection 1804 for connecting a reference capacitor 1705, general purpose input/output ports 1808, temperature measurement ports 1809 and 1810 for connecting an external resistive temperature sensor 1811, port connection 1814 for connecting an external discharge resistor 1815 and port connection 1817 for connecting an external temperature measurement reference sensor 1819, port connection 1820 for connecting, for example, to a bypass capacitor in order to protect the circuit against transient voltage fluctuations. Supply voltage (Vdd) connectivity is established through port connection 1822, with a bypass path to the ground provided by a bypass capacitor 1824, and ground connectivity is provided through port connection 1826. In the PCAP01 IC 1800 temperature measurement, similar to the capacitance measurement, is discharge time based. Therefore, an external capacitor 1828 may be connected to the external resistive temperature sensor 1811 as shown in FIG. 18.

Figure 19:
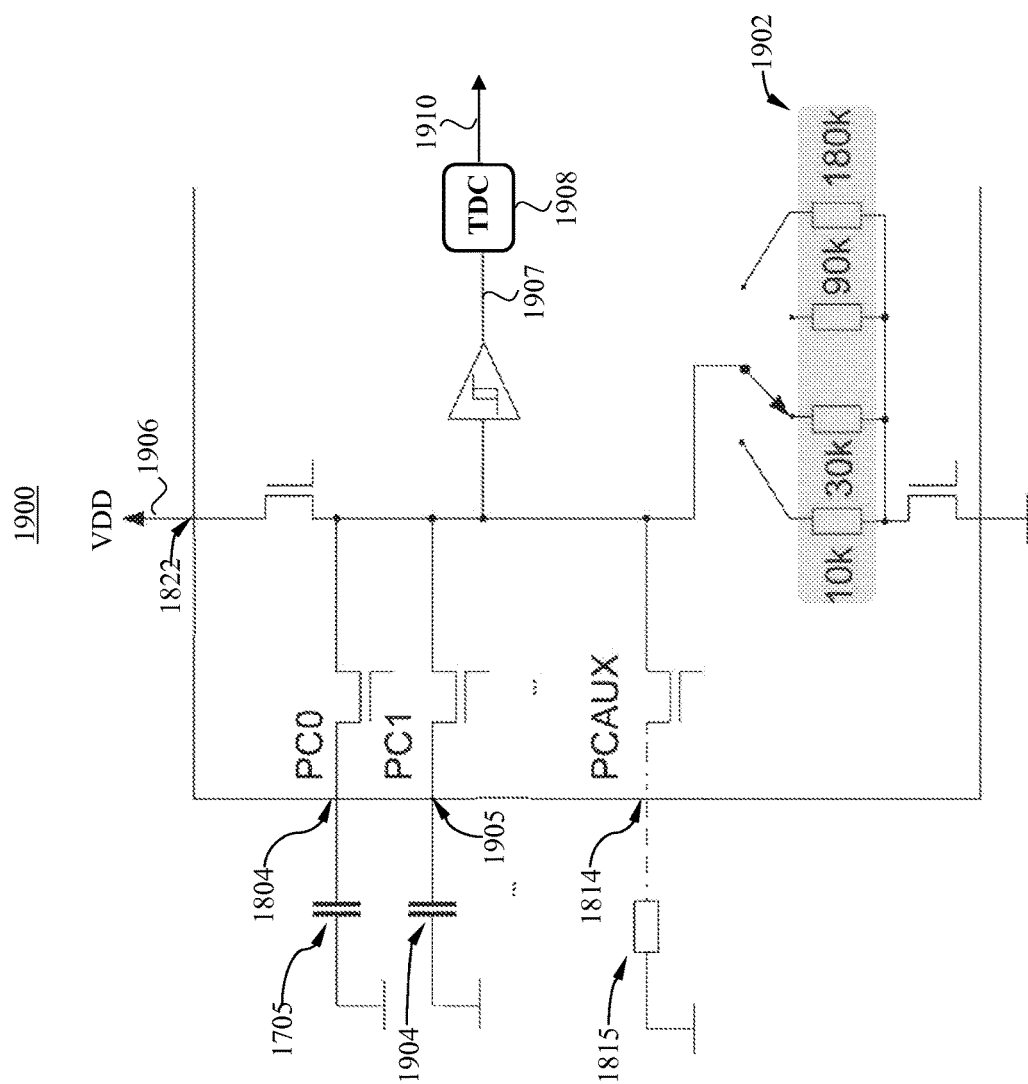
FIG. 19 illustrates an exemplary capacitance measurement schematic 1900, according to one embodiment of the present invention.

As stated above, the capacitance measurement method utilized by the PCAP01 IC 1800 is based on the measurement of the resistor-capacitor (RC) discharge ante. The capacitors are represented by the radiation-sensitive MOSCAPs 1704 connected to ports 1722 in PCAP01 IC 1800. The resistors are represented by a set of four selectable internal discharge resistors 1902 with respective resistance values, for example, ranging from 10 kΩ to 180 kΩ, as illustrated by the exemplary capacitance measurement schematic 1900, in FIG. 19. The radiation-sensitive MOSCAP 1904, connected to the capacitive measurement port 1905, is charged to the supply voltage (Vdd) 1906 through port connection 1822, and subsequently discharged into a discharge resistor selected from the set of four selectable internal discharge resistors 1902. The radiation-induced MOSCAP 1904 may also be discharged into an external discharge resistor 1815 connected to port 1814. Since the set of four selectable internal discharge resistors 1902 and the external discharge resistor 1815 (in cases where an external discharge resistor functionality is supported) are of known values, based on the discharge time of the radiation-sensitive MOSCAP 1904 relative to the dis-charge time measured for the reference capacitor 1705 (which has a known capacitance value), radiation-induced capacitance response of the radiation-sensitive MOSCAP 1904 may be extracted. The measured discharge time value 1907 may be digitized with a Time-to-Digital Converter (TDC) 1908 to produce a digital output 1910 from which the radiation dose absorbed by the radiation-sensitive MOSCAP 1904 may be extracted.

Figure 20:
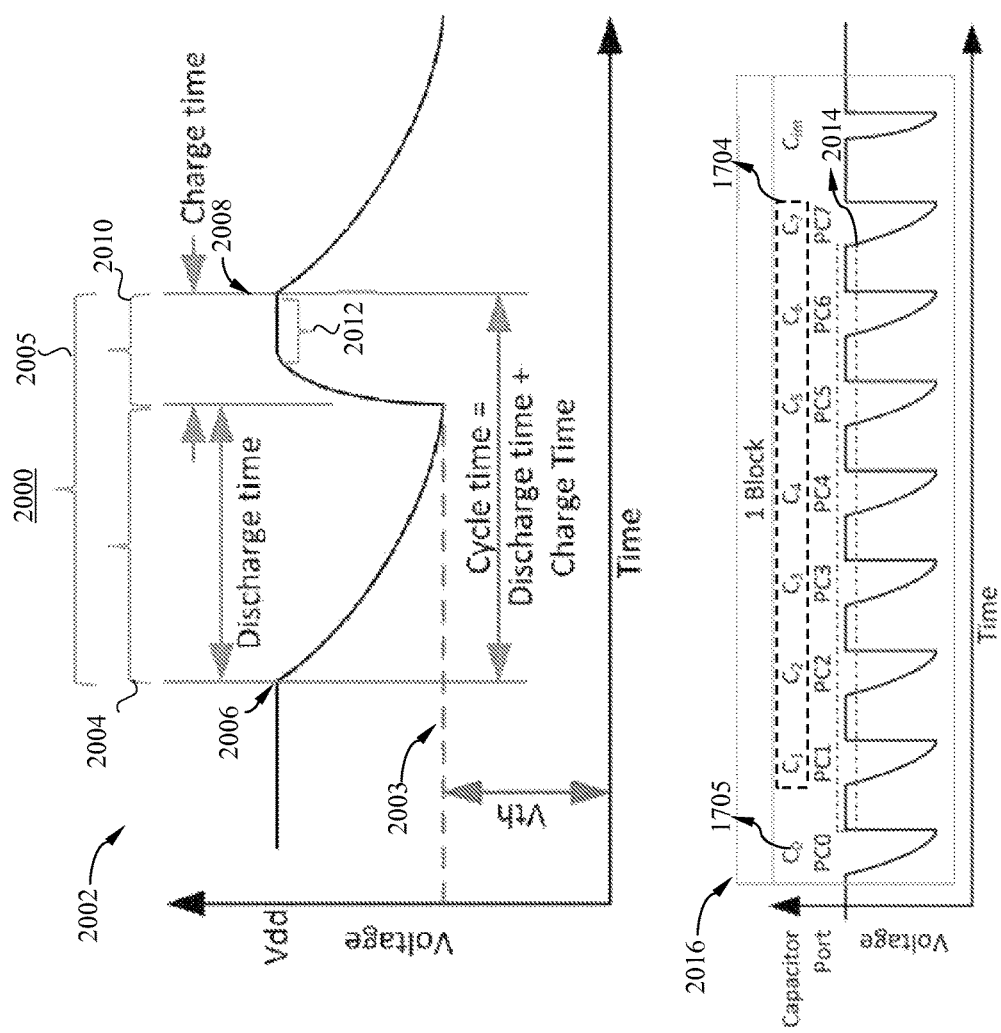
FIG. 20 illustrates an exemplary measurement block represented by a signal trace and a waveform, according to one embodiment of the present invention.

As previously described, the RC discharge time measurement comprises measurement of the time it takes for the voltage across a capacitive device (which may comprise a radiation-sensitive MOSCAP or a reference capacitor), that has been charged initially to, for example, the supply voltage (Vdd), to decrease from the Vdd level to a fraction of its initial value (corresponding to approximately one time constant). This is further demonstrated by the signal trace 2001 in the exemplary waveform illustration 2000 of FIG. 20. In FIG. 20, a capacitive device associated with the signal trace 2002 is discharged from its initial Vdd voltage level to a voltage level 2003, which corresponds to the threshold voltage ($V_{th}$) of the capacitive device, during the discharge time 2004. The total time between two consecutive discharge cycles may be defined as the cycle time. As illustrated by the signal trace 2002, a cycle time 2005, which may be set by the user, is the time interval between discharge cycles 2006 and 2008. In preferred embodiments of the present invention the cycle time 2005 may be equal to or greater than the sum of the discharge time 2004 and the charge time span 2010. In the exemplary signal trace 2002, the cycle time 2005 is greater than the sum of the discharge time 2004 and charge time 2010 by an over-head time interval 2012. In select embodiments of the present invention user-defined cycle time is selected to yield a positive over-head time interval, thus ensuring a discharge time measurement that is based on full discharge and charge cycles.

In accordance to one embodiment of the present invention, an exemplary measurement block represented by the signal trace 2016 in FIG. 20, comprises RC discharge time measurements for each capacitive element in a prescribed sequence associated with one or more radiation-sensitive MOSCAPs 1704 and the reference capacitor 1705. The PCAP 01 IC 1800 returns a discharge time, associated with a radiation-sensitive MOSCAP, that is normalized, for example, to a reference magnitude (i.e. the discharge time of the reference capacitor). Therefore the returned discharge time corresponds to a ratio of sensor (radiation-sensitive MOSCAP) discharge time ($\tau_{Sens}$) and the reference capacitor discharge time ($\tau_{Ref}$). As described above, in the select embodiment of the present invention the discharge time corresponds to a period of approximately one time constant ($\tau$). Considering that the ratio of the reference capacitance ($C_{Ref}$) and the sensor (radiation-sensitive MOSCAP) capacitance ($C_{Sens}$) is equal to the ratio of the respective time constants (as shown by equation 1), the capacitance value of the sensor (radiation-sensitive MOSCAP) can be represented by the expression in equation 2.

$$\frac{\tau_{Sens}}{\tau_{Ref}} = \frac{C_{Sens}}{C_{Ref}} \qquad \text{(Equation 1)}$$

$$C_{Sens} = \frac{\tau_{Sens}}{\tau_{Ref}} C_{Ref} \qquad \text{(Equation 2)}$$

In order to reduce measurement noise and enhance measurement resolution of the radiation-induced capacitance response, in accordance to one embodiment of the present invention, a prescribed number of discharge time measurement samples, for both the one or more radiation-sensitive MOSCAPs and the reference capacitor are obtained. The measured discharge time values, for both the one or more radiation-sensitive MOSCAPs and the reference capacitor, are averaged over a prescribed number of measurement samples and the averaged values are used to calculate the capacitance of the one or more radiation-sensitive MOSCAPs according to equation 2. The signal to Noise (SNR) of the measured discharge time data is proportional to the square root of the number of samples, hence averaging over a greater number of samples may enhance the measurement precision and resolution of the absorbed radiation dose in the one or more radiation-sensitive MOSCAPs.

Accordingly, by utilizing a MOSCAP to thereby produce a radiation-induced capacitance response with enhanced sensitivity by way of external biasing and optimization of MOSCAP fabrication and design parameters and furthermore by increasing the capacitance measurement precision (hence, the radiation measurement precision) by ensuring capacitance measurement in MOSCAP depletion region of operation (at or around the inflection point) and by implementing a measurement algorithm that utilizes averaging of measured capacitance values over a prescribed number of samples to reduce the measurement noise and enhance the measurement Signal-to-Noise (SNR) ratio, in accordance to the exemplary procedure and methodology described above, a high sensitivity, high resolution measurement of received radiation dose based on measurement of MOSCAP capacitance may be obtained. In accordance to one embodiment of the present invention, a twenty-fold increase in the relative measurement's precision, compared to C-V meter based capacitance measurements, is achieved with the disclosed capacitance measurement methodology.

Figure 21:
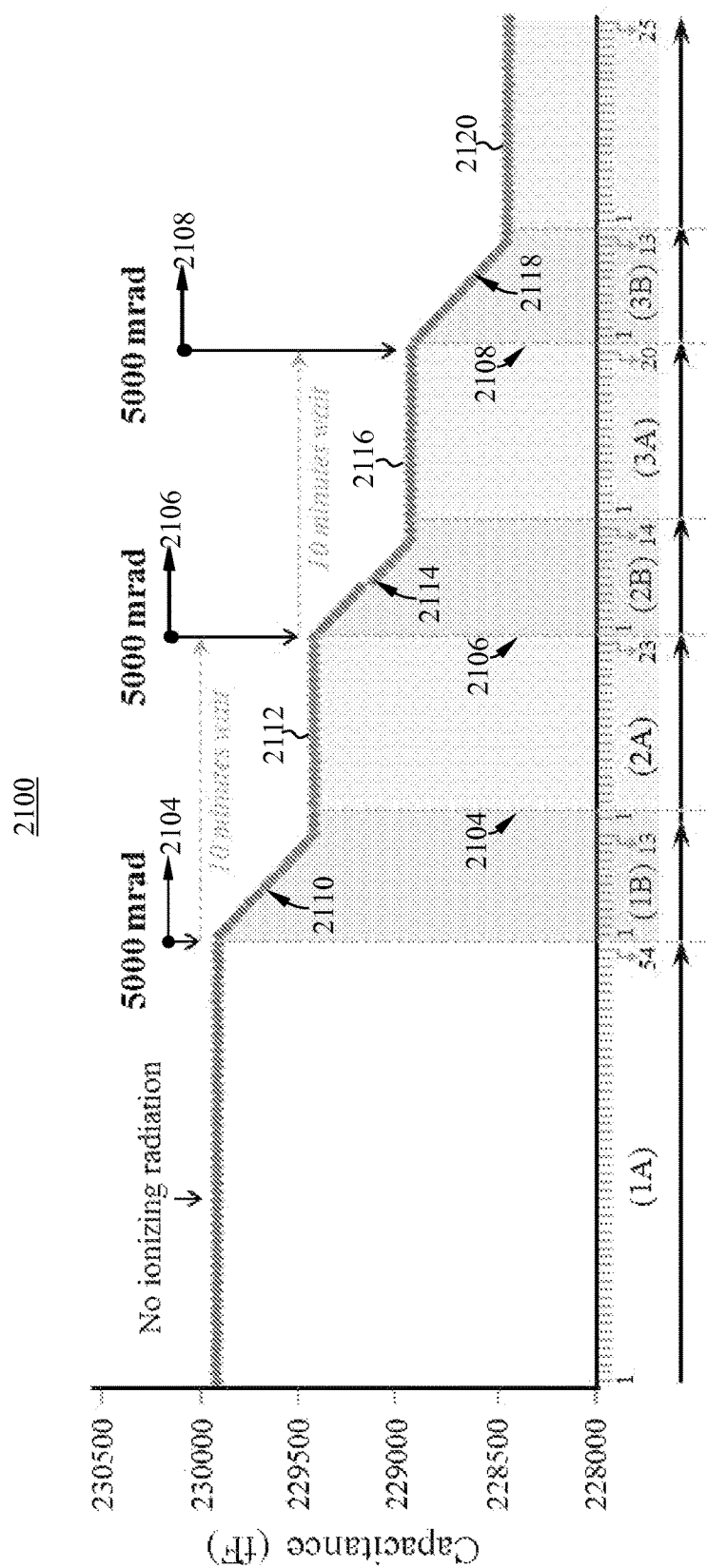
FIG. 21 is an illustration radiation-sensitive MOSCAPs capacitance responses to a radiation exposure profile comprised of 5000 mrad dose levels, measured in depletion operation regions.

In accordance to one embodiment of the present invention, the measurement of radiation-induced capacitance response, in the depletion operating regions, for an exemplary MOSCAPs with radiation-sensitive insulating layer, is performed by PCAP01 IC 1800 and illustrated in FIG. 21. The incident radiation dose that is distinguishable in the profile of the MOSCAP capacitance response can be identified in the capacitance time-trace 2100 measured under radiation exposure.

FIG. 21 represents a measured depletion region capacitance time-trace 2100 for an exemplary MOSCAP with a Dibenzoylmethane-based (DBM-A1-09) insulating layer irradiated with three doses of 5000 mrad at 10 minutes intervals corresponding to irradiation events 2104, 2106 and 2108. For the MOSCAP capacitance time-trace 2100, measured in the depletion region, the induced response to the first irradiation event 2104 is represented by waveform segment 2110 and 2112, the induced response to the second radiation event 2106 is represented by waveform segments 2114 and 2116 and the induced response to the third irradiation event is represented by waveform segments 2118 and 2120. The radiation-induced capacitance response for the MOSCAP operating in the depletion region exhibits a deterministic behavior, exemplified by a linear reduction 2110, 2114 and 2118 to a steady constant value 2112, 2116 and 2120 that exhibit a linearly proportional relationship to the received radiation dose.

As illustrated in FIG. 21 the radiation-induced MOSCAP capacitance, when measured in depletion exhibits a linear and predictable response to absorbed radiation dose and can thus be calibrated and used as a reliable measure of received radiation dose. However, environmental factor other than radiation that influence the capacitance response of the MOSCAP may introduce noise and uncertainty in the measured capacitance response.

When developing capacitive sensors, environmental parameters such as, for example, temperature, humidity and electromagnetic interference (EMI) are among the largest sources of parasitic. Typically a temperature sensors is used and a calibration table is generated so that a temperature dependent factor can be removed from the sensor response. Additional sensors may be needed for factors such as humidity, EMI, pressure, etc.

Therefore, as mentioned earlier, in select embodiments of the present invention, the front-end sensing/processing unit 1301 may further comprise additional functionality such as, for example, temperature sensing. Thus providing the necessary temperature measurements that may be used to compensate for the temperature induced drift in the measurement of the radiation-induced capacitance response in one or more radiation-sensitive MOSCAPs. An exemplary implementation of temperature sensing functionality is illustrated with a resistive temperature detector (RTD) 1314, which exhibits a predictable change in resistance as the temperature changes, and therefore may serve as an indicator of the operating temperature for the one or more radiation-sensitive MOSCAPs 1304.

Figure 22:
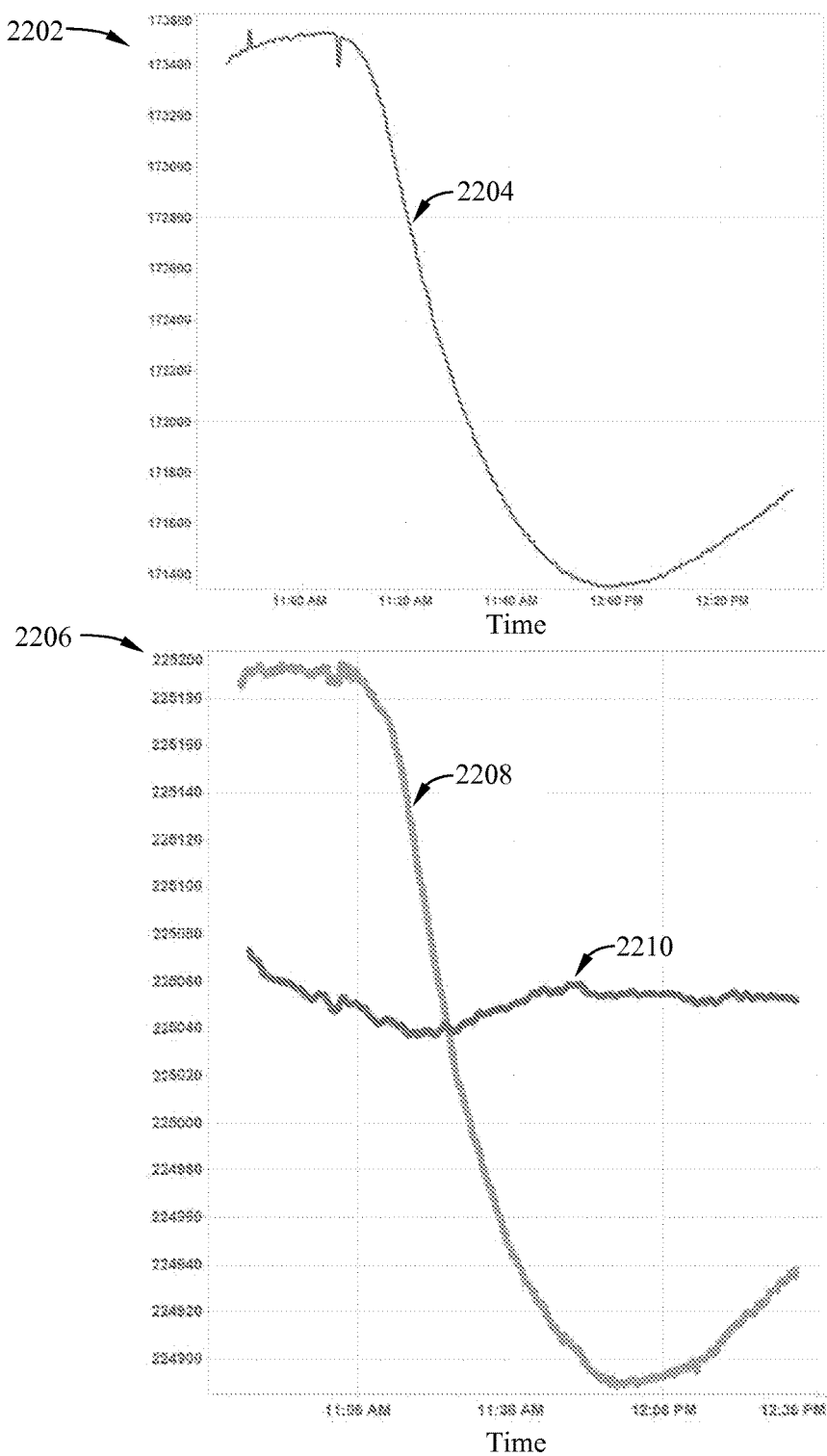
FIG. 22 is an illustration of an induced capacitance response in an exemplary MOSCAP before and after correction of temperature-induced effect, according to one embodiment of the present invention.

In FIG. 22 measurement 2202 illustrate temperature variation waveform 2204 acquired with, for example, PT100 Resistive Temperature Detector (RTD), over a two hour time period. Measurement 2206 illustrate capacitance variation waveform 2208 for an exemplary MOSCAP measured for the same time period and under the same temperature conditions illustrated by the temperature variation waveform 2204. Waveform 2210 illustrates the capacitance response of the exemplary MOSCAP after correcting for the effect of temperature variations on the performance of the device. Thus achieving precision in measurement of radiation-induced MOSCAP capacitance response requires consideration and correction of environmental factors that may influence the capacitance of the MOSCAP.

Consequently, by inducing a shift in MOSCAP capacitance response, environmental effect such as, for example, variations in temperature or humidity, may limit the minimum resolvable radiation dose, and may result in false positives readouts wherein a failure mechanism of a sensor may be perceived as dose. The impact of environmental parameters may be specially relevant for capacitive sensor looking at very small signal levels. Temperature variations comprise a primary source of environmental noise in MOSCAP radiation sensors. Utilizing external temperature sensing element to compensate for temperature induced effects on the radiation sensor response has some limitations, however, as resolution and accuracy of the temperature sensors are limited. There may even be local effects such as, for example, the microcontroller increasing the temperature of radiation sensors on the PCB at a different rate than that of the temperature sensing element. The existence of a temperature gradient between the temperature sensing element and radiation-sensitive MOSCAPs reduces the precision with which temperature effects may be compensated for.

In accordance to one aspect of the present invention an apparatus with no susceptibility to environmental noise and a method for suppression of the same is disclosed based on a combined n-type and p-type MOSCAP radiation sensor resulting in plurality of measurements comprising both the n-type and p-type MOSCAP capacitance response measurements. By combining n-type and p-type MOSCAP sensors together many environmental effects may be cancelled through combination of the signal response from both MOSCAP types. Combination of the signal response may comprise subtraction, addition, multiplication or any other mathematical operation that utilizes both signal response quantities as operations variables.

In accordance to one embodiment of the present of the invention, effect of temperature stimuli on the sensor response parameter may be isolated from radiation-induced capacitance response of the combined sensor by subtraction of p-type MOSCAP capacitance response from that of the n-type MOSCAP or vice versa. This is because the capacitance parameter of the n-type MOSCAP and the p-type MOSCAP shift in opposite directions in response to incident radiation dose, which is contrary to many environmental effects, and would uniformly increase or decrease the capacitance in both sensors. The capacitance parameter of the n-type MOSCAP and the p-type MOSCAP shift in same direction in response to the environmental parameter, such as, for example, temperature variations. Coupling n-type and p-type MOSCAP sensors together, may also significantly improves the confidence level in a dose event and increase sensitivity by approximately a factor of two since the difference between the base capacitance of the two sensors after a radiation-induced shift is double that of a single sensor. This solution may also reduce hardware requirement, as fewer sensors may be needed to maintain the same environmental noise levels.

Figure 23:
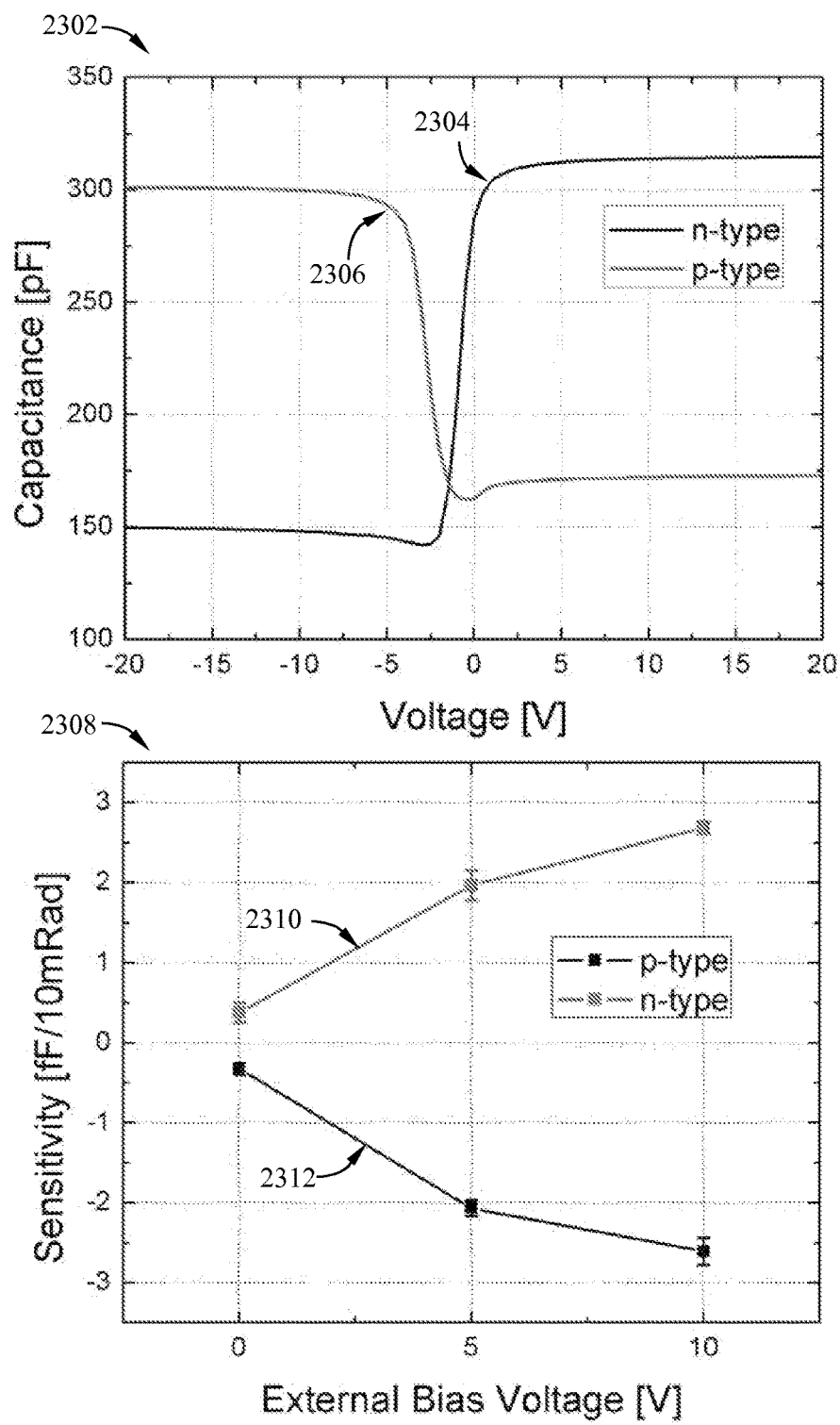
FIG. 23 is an illustration of radiation-induced CV response and sensitivity response for an exemplary n-type and p-type MOSCAPs, according to one embodiment of the present invention.

The mirrored CV response for n-type and p-type MOSCAPs is respectively illustrated by CV curves 2304 and 2306 in the measurement trace 2302 of FIG. 23. This means that as dose is received, an n-type MOSCAP would increase in capacitance and a p-type MOSCAP would decrease in capacitance. As illustrate by waveform trace 2310 and 2312 in the measurement 2308, the combined radiation-induced shift in capacitance response between n-type MOSCAP and p-type MOSCAP sensor correspond to an increase in the minimum resolvable dose and sensitivity by as much as approximately a factor of two compared to that of a single MOSCAP sensor.

Figure 24:
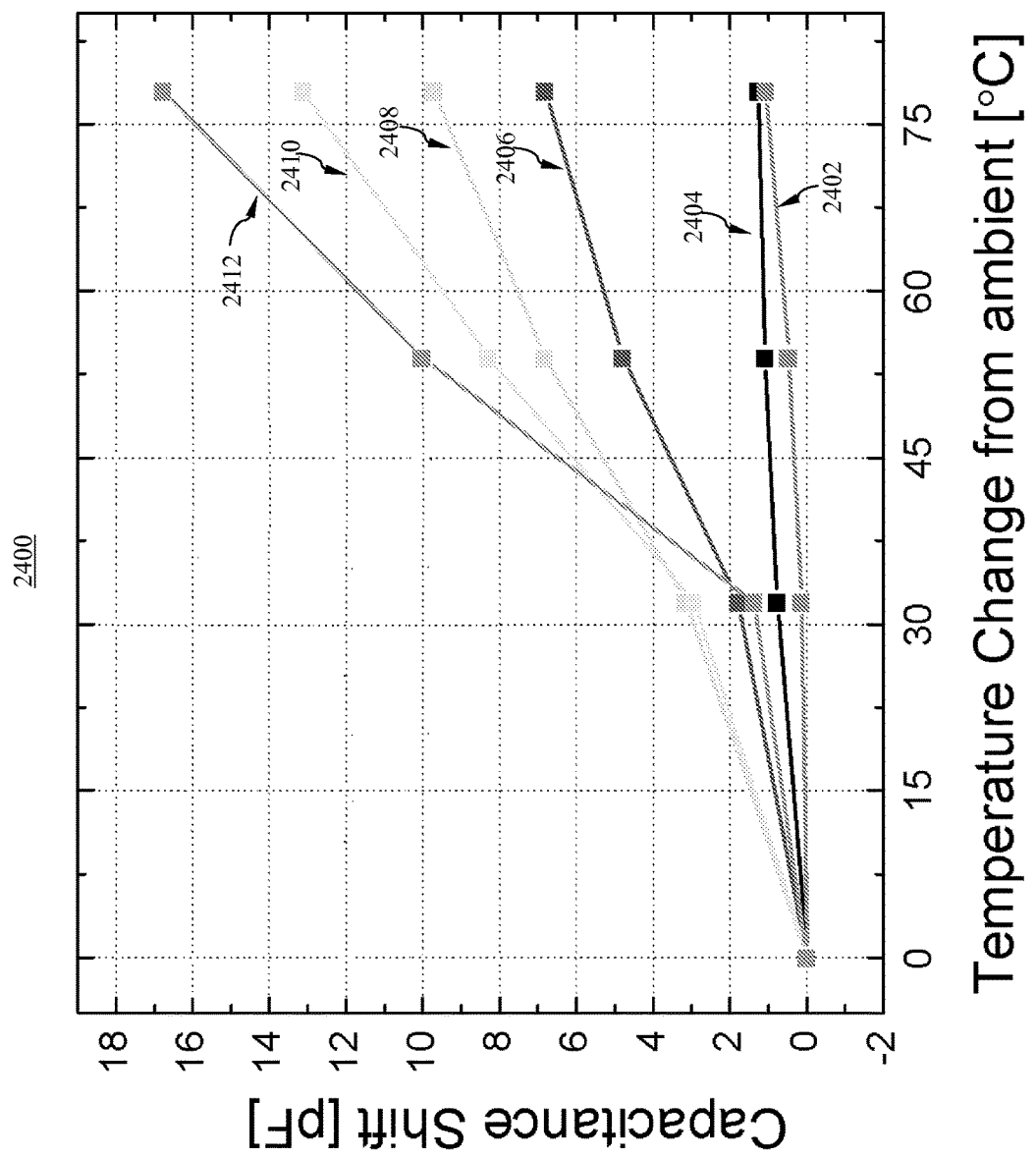
FIG. 24 is an illustration of temperature-induced capacitance shift for an exemplary n-type and p-type MOSCAPs operating in inversion, depletion and accumulation regions, according to one embodiment of the present invention.

Temperature-induced capacitance response measurements 2400, in FIG. 24, illustrate the capacitance shift in response to a range of temperature changes from ambient for an exemplary n-type and p-type MOSCAPs in accumulation, depletion and inversion operation regions. Waveform trace 2402 and 2404 illustrate the measured temperature-induced capacitance response in accumulation operation region for an exemplary n-type and p-type MOSCAPs, respectively. Waveform trace 2406 and 2408 illustrate the measured temperature-induced capacitance at the approximate region of highest slope in depletion operation region for an exemplary n-type and p-type MOSCAPs, respectively. Waveform trace 2408 and 2410 illustrate the measured temperature-induced capacitance response in inversion operation region for an exemplary n-type and p-type MOSCAPs, respectively. The shift in the capacitance is in the same direction in all regions of operation for both the n-type and the p-type MOSCAPs. It should be noted that the n-type and p-type MOSCAPs should exhibit nearly identical response and any deviation in their measured response may be due to the usage of wafers with slight property differences.

Figure 25:
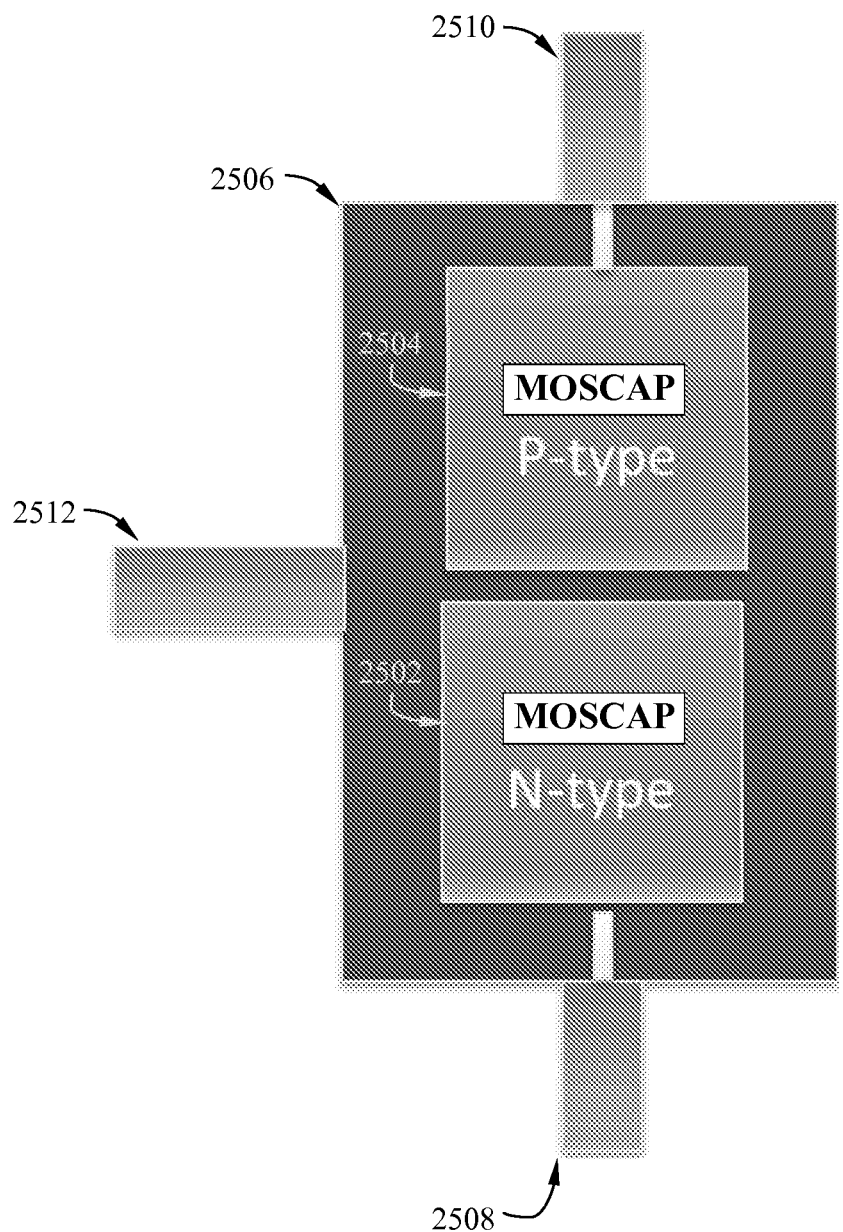
FIG. 25 is an illustration of an exemplary combined n-type and p-type MOSCAP radiation sensor, according to one embodiment of the present invention.

FIG. 25 illustrates a block diagram for one exemplary embodiment of a combined n-type and p-type MOSCAP radiation sensor. The exemplary MOSCAP radiation sensor 2500 comprises a n-type MOSCAP 2502 and p-type MOSCAP 2504, disposed in a substrate body 2506. The exemplary MOSCAP sensor 2500 further comprises a n-type MOSCAP connection 2506, p-type MOSCAP connection 2508, Substrate body connection, 2510.

In accordance to one embodiment of the present invention n-type MOSCAP 2502 and p-type MOSCAP 2504 may be fabricated on the same substrate as illustrated by combined structure 2500, while in other embodiments of the present invention, n-type and p-type MOSCAPs 2502 and 2504 may be packaged together.

In accordance to one embodiment of the present invention, a combined n-type and p-type MOSCAP radiation sensor is sensor may be implemented on a semiconductor substrate having at least two portions with opposite polarity conductivity and insulated form plurality of adjacently disposed non-contacting conductive top gate layers by a contiguous dielectric layer interposed between the substrate and the plurality of adjacently disposed non-contacting conductive top gate layers. For illustrative purposes, select embodiments of combined n-type and p-type MOSCAP structure are described further in FIG. 26 and FIG. 27.

Figure 26:
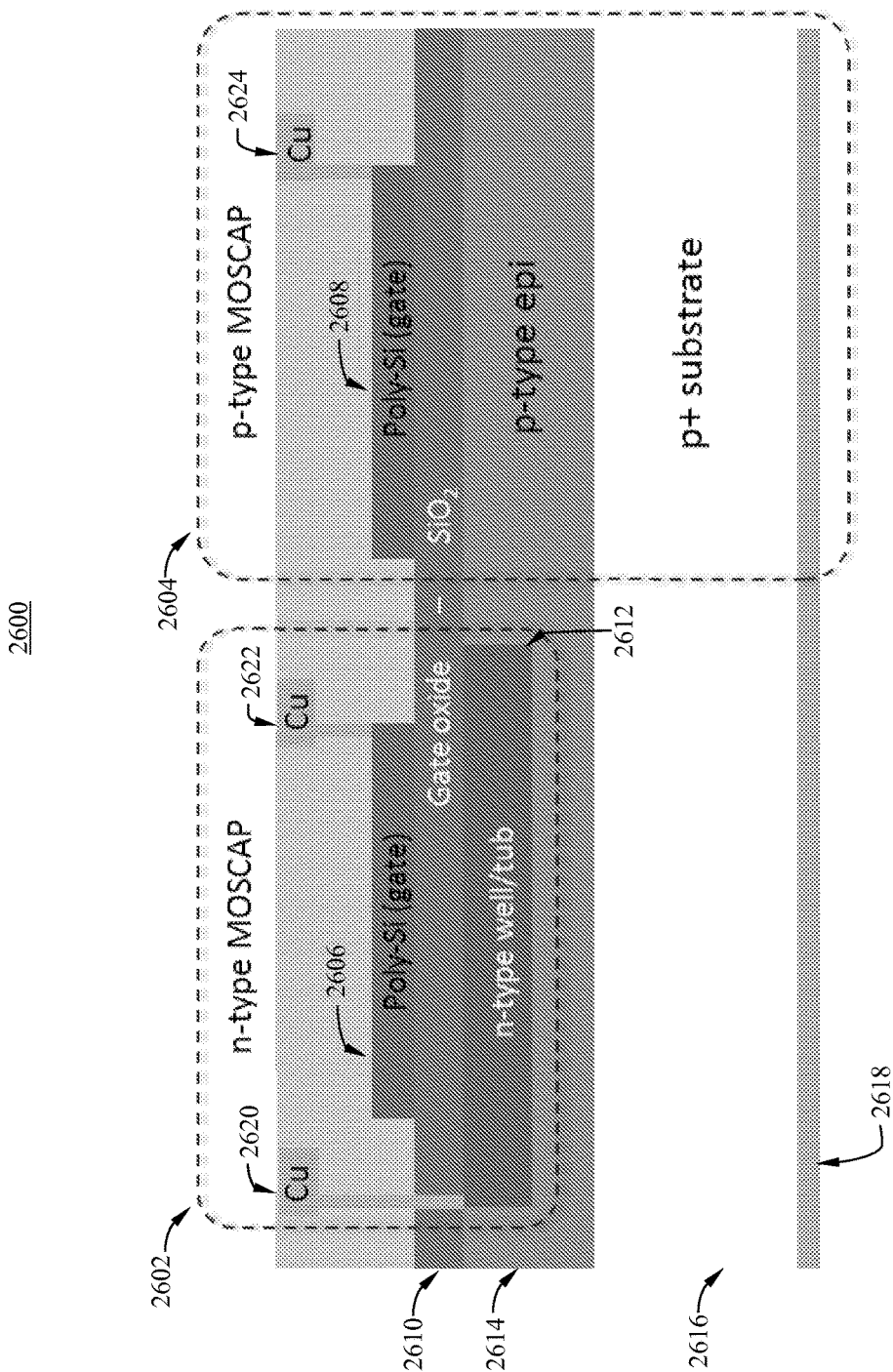
FIG. 26 is an illustration of an exemplary implementation of a unified structure for a combined n-type and p-type MOSCAP radiation sensor, according to one embodiment of the present invention.

FIG. 26 illustrate a cross-sectional representation of an exemplary structural implementation of the combined n-type and p-type radiation-sensitive MOSCAP sensor 2600, in accordance to one embodiment of the present invention. The exemplary structure comprise a n-type MOSCAP portion 2602 and a p-type MOSCAP portion 2604. The n-type MOSCAP portion 2602 and the p-type MOSCAP portion 2604 may respectively comprise a conductive gate layer 2606 and 2608. The adjacently disposed non-contacting conductive gate layers 2606 and 2608 may be further disposed over a contiguous dielectric layer 2610, wherein the contiguous dielectric layer 2610 may form a contiguous radiation-sensitive layer for absorption of incident radiation dose.

In some embodiments of the present invention contiguous dielectric layer 2610 may be comprised of different dielectric layers disposed and in contact below the top conducting gate layers 2606 and 2608.

The n-type MOSCAP portion 2602 may further comprise a n-type implant 2612, such as, for example, an n-type diffusion implant (n-type well or tub), disposed below top conducting gate layer 2606 and insulated therefrom by a common insulating oxide layer, such as the contiguous dielectric layer 2610. The n-type implant, for example, representing a bottom conducting plate of n-type MOSCAP portion. Both n-type MOSCAP portion 2602 and p-type MOSCAP portion 2604 are disposed upon a common epitaxial layer 2614. Epitaxial layer 2614 is isolated from conductive gate layer 2608 of the p-type MOSCAP portion 2604 by common insulating oxide layer 2610. Combined n-type and p-type radiation-sensitive MOSCAP sensor 2600 may further comprise a base substrate layer 2616, disposed below epitaxial layer 2614, and a contact layer 2618 coupled to base substrate 2616. The stacked combination of epitaxial layer 2614 and base substrate 2616, for example, representing a bottom conducting plate of p-type MOSCAP portion. The exemplary sensor structure 2600 may also comprise contact layers 2620, 2622 and 2624 coupled to n-type implant 2612, conductive gate layer 2606 in n-type MOSCAP portion 2602 and conductive gate layer 2608 in p-type MOSCAP portion 2624, respectively. In some embodiment of the present invention base substrate 2616 may comprise a heavily-doped p-type base substrate and epitaxial layer 2614 may comprise a lightly-doped p-type epitaxial layer.

In other embodiment of the present invention, base substrate 2616 and epitaxial layer 2614 may respectively comprise a heavily-doped and lightly-doped n-type material. In this configuration p-type MOSCAP portion 2604 may comprise a p-type implant insulated from conductive gate layer 2608 by a common insulating oxide layer such as contiguous dielectric layer 2610 and n-type MOSCAP portion 2602 may comprise bottom conducting plate comprising of lightly-doped n-type epitaxial layer disposed over a heavily-doped n-type base substrate. In accordance to some embodiments of the present invention the adjacently disposed non-contacting conductive gate layers 2606 and 2608 may be selected form a group comprising metal or poly silicon material.

Figure 27:
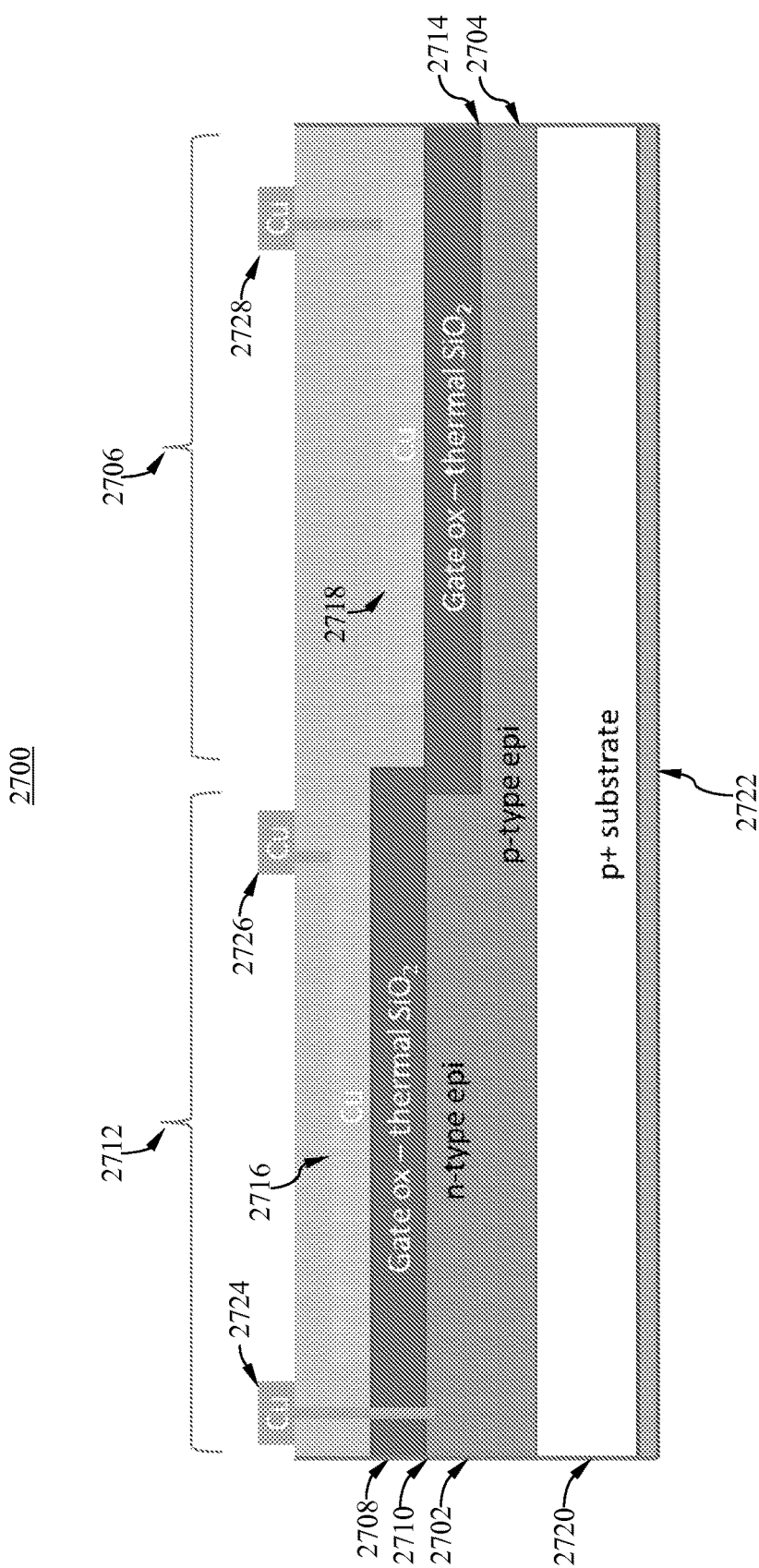
FIG. 27 is an illustration of an exemplary implementation of a unified structure, for a combined n-type and p-type MOSCAP radiation sensor, according to one embodiment of the present invention.

FIG. 27 illustrate a schematic representation of an exemplary structural implementation of a combined n-type and p-type radiation-sensitive MOSCAP sensor 2700, in accordance to one embodiment of the present invention. MOSCAP sensor 2700 may utilize a stacked n-type and p-type epitaxial layer configuration comprising, for example, of n-type epitaxial layer 2702 disposed over p-type epitaxial layer 2704 with n-type epitaxial layer etched away in the region 2706 associated with p-type MOSCAP portion. Dielectric layer 2708 disposed on a surface comprising of a n-type epitaxial top-surface portion 2710 in the n-type MOSCAP portion 2712 and p-type epitaxial top-surface 2714 of p-type epitaxial layer 2704 in p-type MOSCAP portion 2706. The exemplary MOSCAP structure 2700 may further comprise a top conducting gate layer 2716 and 2718 disposed and in non-contact over n-type epitaxial top surface portion 2710 of n-type epitaxial layer 2702 in n-type MOSCAP portion 2712 and p-type epitaxial layer top surface portion 2714 of p-type epitaxial layer 2704 in p-type MOSCAP portion 2706, respectively. In one embodiment of the present invention top conducting gate layers 2716 and 2718 may be selected from a group comprising metal layer or poly-silicon layer. MOSCAP sensor may further comprise a base substrate layer 2720 and a conducting contact 2722 coupled to base substrate 2720. In some embodiments of the present invention base substrate may comprise heavily-doped p-type material. The MOSCAP sensor 2700 may further comprise conducting contacts 2724, 2726 and 2728 respectively coupled to n-type epitaxial 2702 in n-type MOSCAP portion 2712, top conducting layer 2716 and top conducting layer 2718.

Although FIGS. 25, 26 and 27 show an embodiment of the invention in which a single radiation sensor functions as a combined n-type and p-type radiation-sensitive MOSCAP sensor, in other embodiments of the present invention, the radiation sensor may be an n-type radiation-sensitive MOSCAP sensor or a p-type radiation-sensitive MOSCAP sensor. In one embodiment of the present invention, an n-type radiation sensor could have a structure based on the left half of the MOSCAP sensor shown in FIG. 26 that includes the n-type MOSCAP portion of the MOSCAP sensor. In one embodiment of the present invention, an n-type radiation sensor could have a structure based on the left half of the MOSCAP sensor shown in FIG. 27 that includes the n-type MOSCAP portion of the MOSCAP sensor. In one embodiment of the present invention, a p-type radiation sensor could have a structure based on the right half of the MOSCAP sensor shown in FIG. 26 that includes the p-type MOSCAP portion of the MOSCAP sensor. In one embodiment of the present invention, a p-type radiation sensor could have a structure based on the right half of the MOSCAP sensor shown in FIG. 27 that includes the p-type MOSCAP portion of the MOSCAP sensor.

Figure 28:
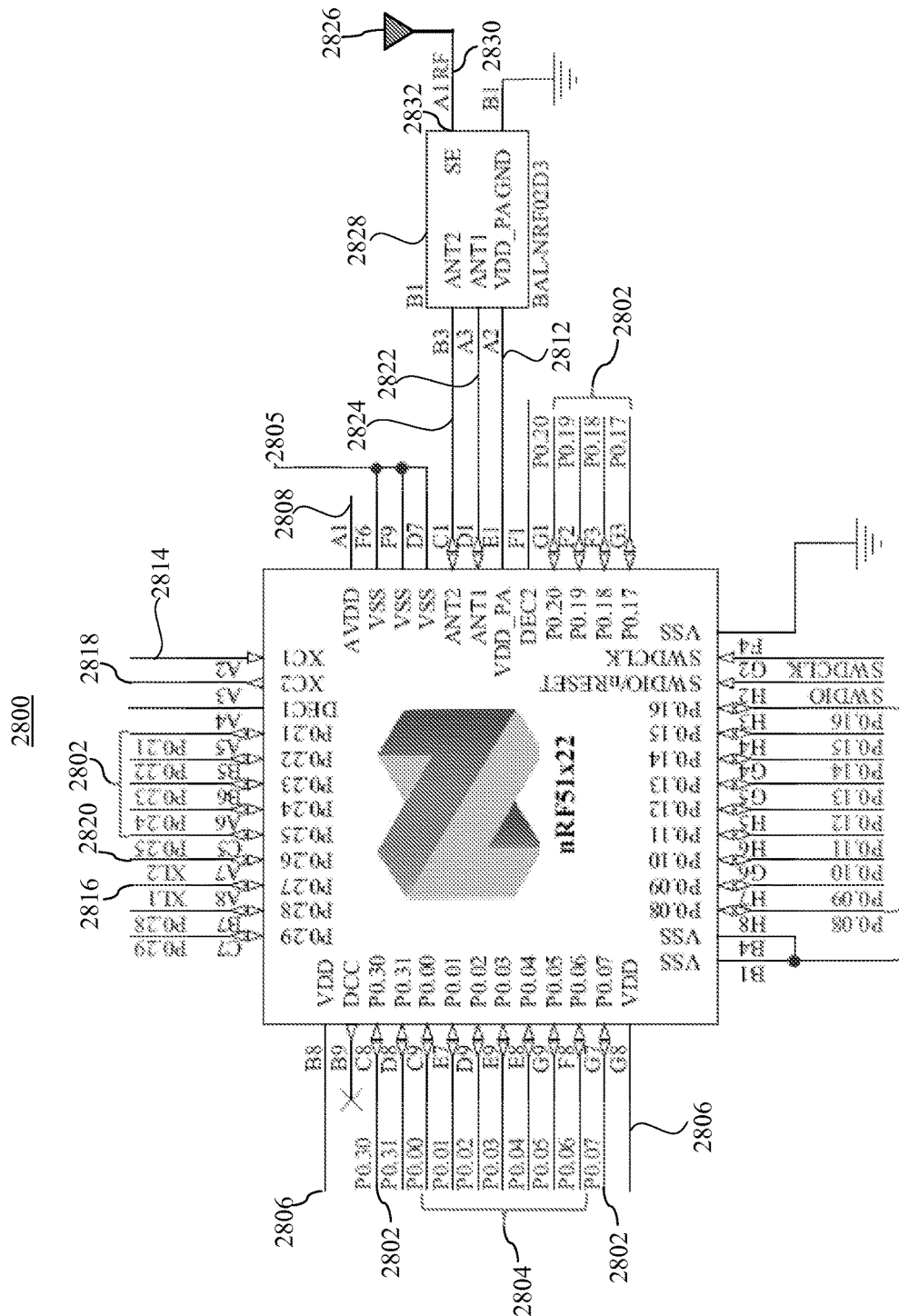
FIG. 28 is an illustration of an exemplary microprocessor/wireless transceiver integrated circuit (IC) utilized for storage, processing and wireless transmission of radiation-sensitive MOSCAP sensor data, according to one embodiment of the present invention.

In some embodiments of the present invention, a separate n-type radiation-sensitive MOSCAP sensor and a separate p-type radiation sensitive MOSCAP sensor may be used together to provide the radiation sensor functionality similar to the functionality provided by combined n-type and p-type radiation-sensitive MOSCAP sensors shown in FIGS. 26, 27 and 28.

A select embodiment of the earlier described microprocessor/wireless transceiver IC 1308 is illustrated in FIG. 28. Here, an application of the aforementioned microprocessor/wireless transceiver IC 1308 is employed as a Nordic nRF51422 SoC IC 2800. Nordic nRF51422 SoC IC 2100 comprises a set of digital input/output (I/O) ports 2802, a set of ports 2804 that can support both digital Input/output (I/O) and analog input function, ground connectivity ports 2805, Vdd power supply connectivity ports 2806, analog power supply connectivity ports 2808 for RF functionality, output power supply port 2812 for providing supply voltage for on-chip RF power amplification, analog input ports 2814 and 2816 for high and low frequency reference clock input connectivity, analog output port 2818 and 2820 for high and low frequency reference clock output connectivity, RF ports 2822, 2824 for differential transmit and receive (TX and RX) connectivity to an on-board antenna transceiver 2826 through an antenna matching circuitry 2128. The outgoing RF signal 2830 on port 2832 of the antenna matching circuitry 2828 is sent to the on-board antenna transceiver 2826 for wireless transmission to a local/remote system.

In one embodiment, a Nordic S310 Bluetooth® 4.0 Soft-Device (protocol stack) is implemented in conjunction with radio hardware such as, for example, the antenna transceiver 1310 for providing wireless connectivity and communication functionality between the front-end sensing/processing unit 1301 and the far-end processing/reporting unit or base station 1302.

In one embodiment, the microprocessor/wireless transceiver IC 1308 may be used to process and average some of the data from the capacitive readout IC 1306, and to store the averaged value. In the disclosed embodiment, when a user is close to a far-end processing/reporting unit or base station 1302, a Bluetooth® link, using the Nordic S310 Bluetooth® 4.0 protocol stack is established between the front-end sensing/processing unit 1301 and the base station 1302 and the generated environmental sensing data (i.e. absorbed radiation dose and temperature and acceleration related data) are uploaded to the base station 1302. The number of readings taken by the front-end sensing/processing unit 1301 per day and the number of readings transmitted to the base station 1302 are programmable. These are application-dependent with the primary tradeoff of frequent sampling being the relatively-large power consumption of the wireless transmission compared to the rest of the system.

Figure 29:
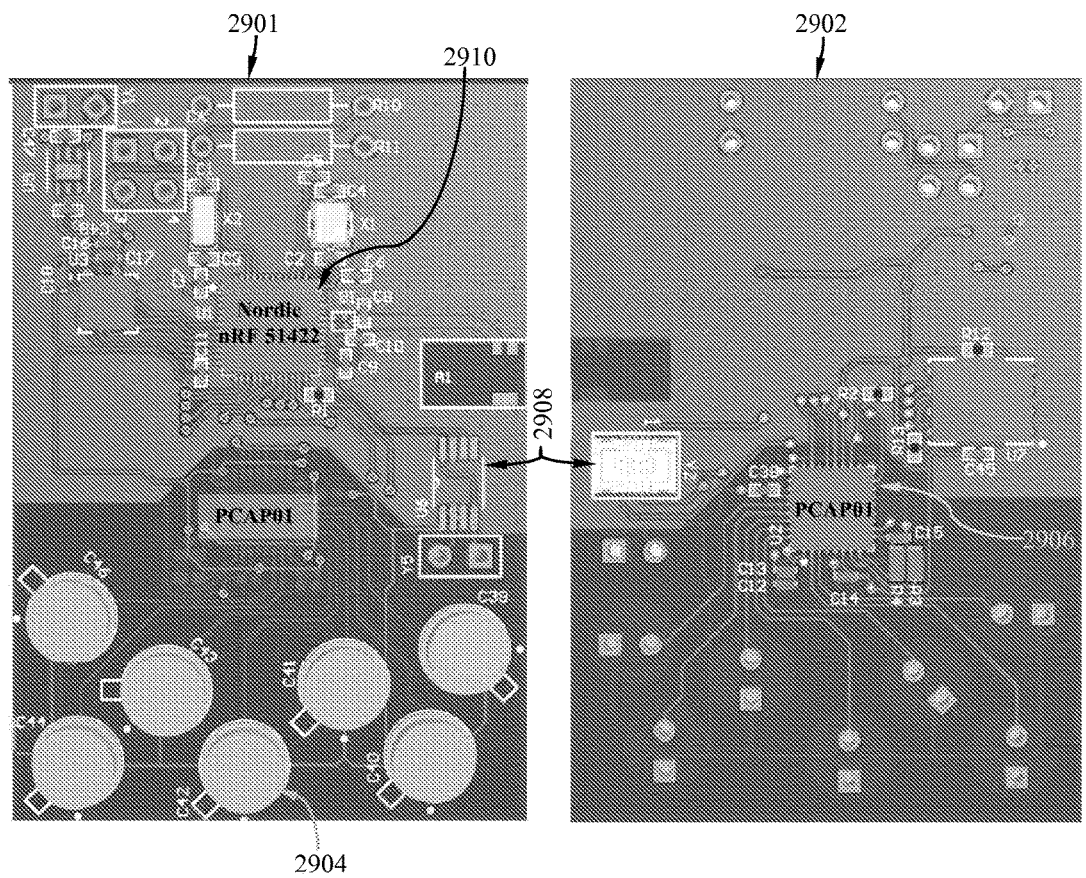
FIG. 29 is a CAD image of the front-end sensing/processing unit of the solid-state dosimeter system, according to one embodiment of the present invention.

FIG. 29 represents a CAD image of the front-end sensing/processing unit 1301 of the solid-state dosimeter system 1300, in accordance to one embodiment of the present invention. The system 1301 is implemented on an exemplary double-sided Printed Circuit Board (PCB) 2900, having a front side 2901 and a back side 2902. The exemplary PCB 2900 comprises: one or more radiation-sensitive MOSCAPs sensors 2904 for producing a capacitance response in proportion to the absorbed radiation dose; a capacitive readout IC, represented by the PCAP 01 IC 2906, for electronic measurement and digitization of the radiation-induced capacitance response of the one or more radiation-sensitive MOSCAP sensors 2904; an active bias switching circuit 2908 for alternately coupling the one or more radiation-sensitive MOSCAP sensors 2904 to a biasing source and to the PCAP 01 IC 2906; a microprocessor/wireless transceiver IC, represented by a Nordic nRf 51422 IC 2910, for processing, storage and wireless transmission of measured environmental data (i.e. radiation dose, temperature and acceleration) with additional real-estate designated for peripheral modules such as temperature sensor and accelerometer, in accordance to one embodiment of the present invention. In one embodiment, the radiation-sensitive MOSCAP sensors are packaged in TO-46 enclosures. The capacitance voltage curves of the sensors are measured to ensure proper operation and inflection voltage. In one embodiment of the present invention all components and sensors are populated on a PCB of about 20 mm×50 mm. In accordance to one embodiment of the present invention, the on-board microprocessor/transceiver IC such as, for example, the Nordic nRF 51422 2910, may be responsible for the storage, processing and wireless transmission to a local/remote base station of the environmental data produced by one or more on-board sensors such as, for example, the one or more radiation-sensitive MOSCAPs 2904 and electronically measured and represented by an on-board capacitive readout IC such as, for example, the PCAP01 IC 2906. The firmware may be flashed to the microprocessor with, for example, read rates and data storage information.

Figure 30:
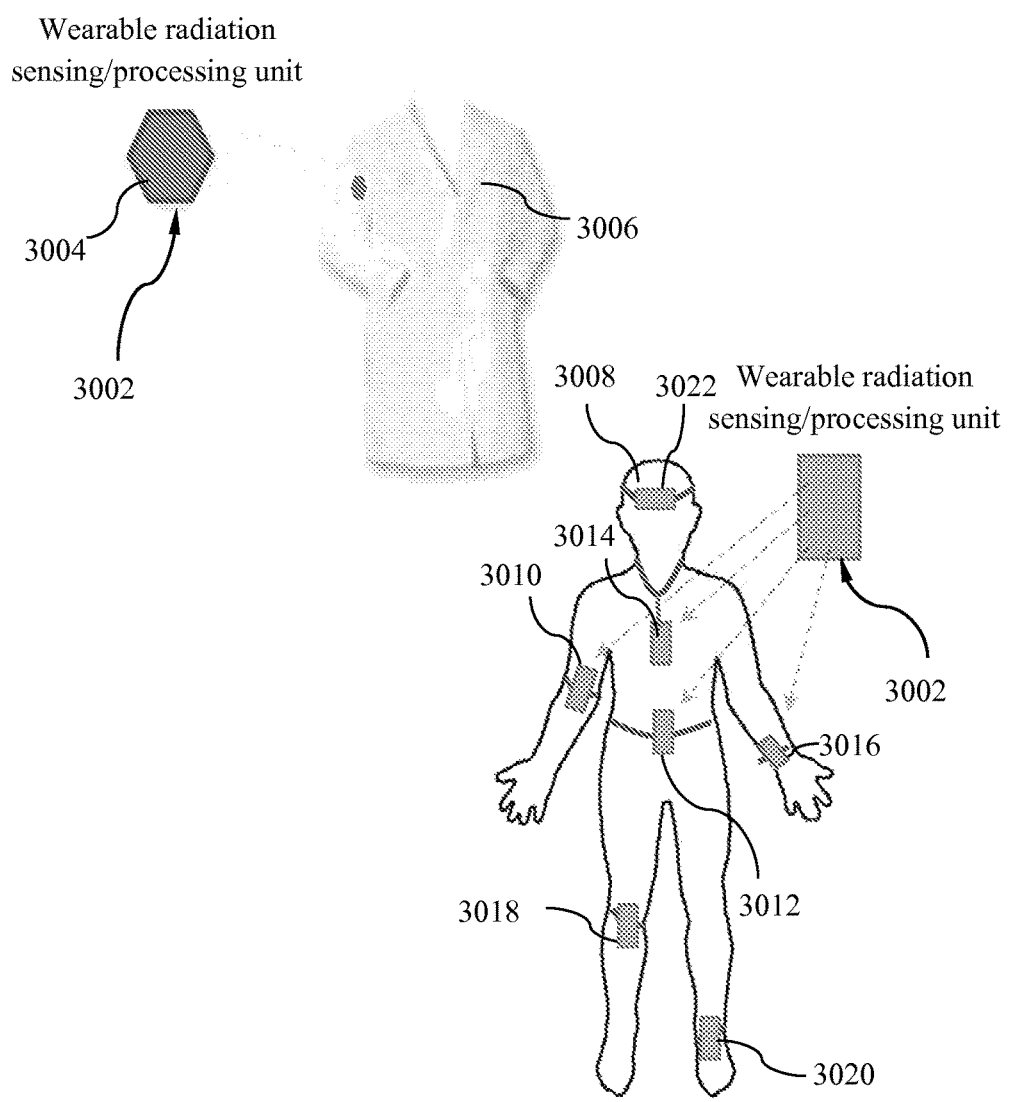
FIG. 30 illustrates exemplary applications of wearable devices, according to embodiments of the present invention.

As discussed earlier above with respect to FIG. 13, disclosed embodiments for occupational dosimetry applications may include front-end sensing/processing unit 1301 of solid-state dosimeter system 1300 implemented as a portable or wearable device. Exemplary applications of wearable devices are illustrated in FIG. 30. Thus, in one embodiment, the disclosed front-end sensing/processing unit 1301 of solid-state dosimeter system 1300 is implemented within wearable device 3002 shown as a badge 3004 affixed to a user's garment 3006. In other embodiments, wearable device 3002 may be implemented and configured to be worn by a user 3008, for example, at or around various extremities such as the arm 3010, the waist 3012, the neck 3014, the wrist 3016, the leg 3018, ankle 3020 and/or head 3022. Thus, disclosed embodiments provide that the wearable device may be mounted, fastened or attached to a user or any part of a user's clothing, or incorporated into items of clothing and accessories which may be worn on the body of a user. Wearable device 3002 may include wearable technology, wearables, fashionable technology, tech togs, fashion electronics, clothing and accessories, such as badges, watches, and jewelry incorporating computer and advanced electronic technologies.

The system, as described in the present technique or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present technique.

The computer system comprises a computer, an input device, a display unit and/or the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. The storage device can also be other similar means for loading computer programs or other instructions into the computer system. The computer system also includes a communication unit. The communication unit allows the computer to connect to other databases and the Internet through an I/O interface. The communication unit allows the transfer as well as reception of data from other databases. The communication unit may include a modem, an Ethernet card, or any similar device which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present technique. The set of instructions may be in the form of a software program. Further, the software may be in the form of a collection of separate programs, a program module with a larger program or a portion of a program module, as in the present technique. The software may also include modular programming in the form of object-oriented programming. The processing of input data by the processing machine may be in response to user commands, results of previous processing or a request made by another processing machine.

Having described the many embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

What is claimed is:

1. A method comprising: measuring a first value of a capacitance response parameter of a first sensor comprising an n-type metal oxide semiconductor capacitor (MOSCAP), and
    measuring a second value of the response parameter of a second sensor comprising a p-type MOSCAP, wherein the first sensor and the second sensor have a same response to a first stimuli, comprising an incident radiation dose, and a different response to a second stimuli, comprising a environmental parameter, thereby isolating an effect of the first stimuli and the second stimuli on the response parameter when both the first stimuli and the second stimuli are present
    the first sensor comprises an n-type metal oxide semiconductor capacitor (MOSCAP) and the second sensor comprise a p-type MOSCAP.

2. The method of claim 1, wherein a first capacitance parameter of then-type MOSCAP and a second capacitance parameter of the p-type MOSCAP shift in opposite directions in response to incident radiation dose.

3. The method of claim 2, wherein the first capacitance parameter of the n-type MOSCAP and the second capacitance parameter of the p-type MOSCAP shift in a same direction in response to the environmental parameter.

4. The method of claim 3, wherein the environmental parameter is temperature.

5. The method of claim 3, wherein the environmental parameter is humidity.

6. The method of claim 3, wherein the environmental parameter is electromagnetic interference (EMI).

7. The method of claim 1, wherein the first value of the response parameter of the first sensor and the second value of the response parameter of the second sensor are displayed on visual display device to a user and/or saved to a non-transient storage medium.

* * * * *